US 9,554,072 B2

(12) United States Patent
Medeiro Hidalgo et al.

(10) Patent No.: US 9,554,072 B2
(45) Date of Patent: Jan. 24, 2017

(54) TWO-STAGE ANALOG-TO-DIGITAL CONVERTER FOR HIGH-SPEED IMAGE SENSOR

(71) Applicant: Innovaciones Microelectrónicas S.L., Sevilla (ES)

(72) Inventors: Fernando Medeiro Hidalgo, Sevilla (ES); Rafael Domínguez Castro, Sevilla (ES)

(73) Assignee: Innovaciones Microelectrónicas S.L., Sevilla (ES)

( * ) Notice: Subject to any disclaimer, the term of this patent is extended or adjusted under 35 U.S.C. 154(b) by 68 days.

(21) Appl. No.: 14/420,258

(22) PCT Filed: Aug. 7, 2013

(86) PCT No.: PCT/EP2013/066571
§ 371 (c)(1),
(2) Date: Feb. 6, 2015

(87) PCT Pub. No.: WO2014/023776
PCT Pub. Date: Feb. 13, 2014

(65) Prior Publication Data
US 2015/0215553 A1   Jul. 30, 2015

(30) Foreign Application Priority Data
Aug. 9, 2012   (EP) .................................... 12179815

(51) Int. Cl.
*H03M 1/12*   (2006.01)
*H04N 5/378*  (2011.01)
(Continued)

(52) U.S. Cl.
CPC ............. *H04N 5/378* (2013.01); *H03M 1/002* (2013.01); *H03M 1/0607* (2013.01);
(Continued)

(58) Field of Classification Search
CPC .......... H03M 1/00; H03M 1/12; H03M 1/365; H03M 1/56; H03M 1/1225
(Continued)

(56) References Cited

U.S. PATENT DOCUMENTS 7,075,475 B1   7/2006   Wan
2009/0261998 A1   10/2009   Chae et al.
(Continued)

FOREIGN PATENT DOCUMENTS

JP   H06237176 A   8/1994
JP   H09500243 A   1/1997
(Continued)

OTHER PUBLICATIONS

Mulliken, G. et al: "Delta-sigma algorithmic analog-to-digital conversion", Proceddings / 2002 IEEE International Symposium on Circuits and Systems: May 26-29, 2002, Fairmount Scottsdale Princess, Phoenix-Scottsdale, Arizona, U.S.A.; [IEEE International Symposium on Circuits and Systems], IEEE, Institute of Electrical and E, May 26, 2002, pp. IV-687, XP002439320, ISBN: 978-0-7803-7448-5,Section 2, 3, 4.1, 6, Equations (8), (9), Figures 1a, 1b, 2a, 2b, 3.
(Continued)

*Primary Examiner* — Joseph Lauture
(74) *Attorney, Agent, or Firm* — Plumsea Law Group, LLC

(57) ABSTRACT

The present invention relates to a two- or multiple-stage analog to digital converter. The converter preferably includes an incremental ADC in the first stage. The incremental ADC comprises an integrator and a comparator. After the predefined number of comparisons performed by the comparator, the output of the integrator appropriately scaled is provided to the second stage where it is further sampled. In particular, the scaling gain is inversely proportional to the
(Continued)

Figure 1A:
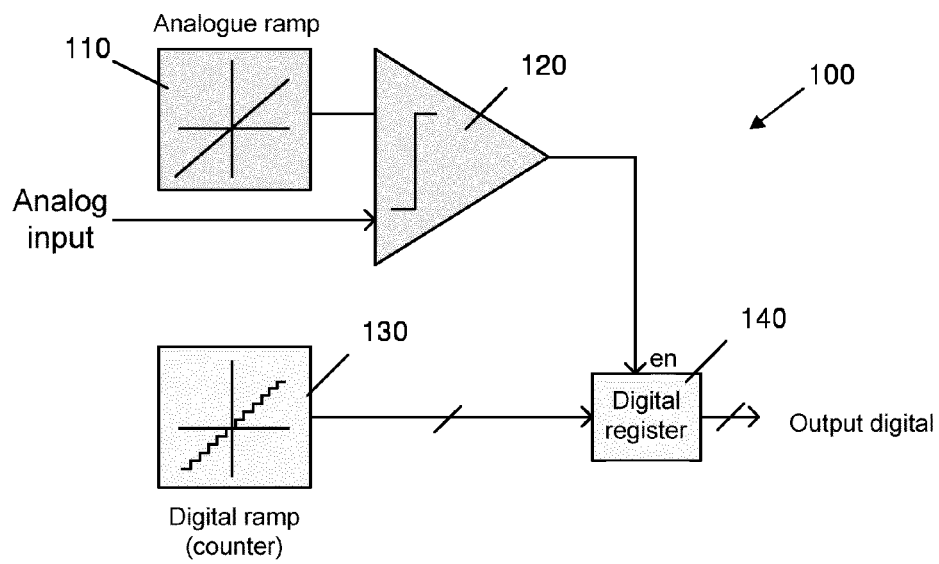

integrator gain. The second ADC performs the conversion of the remaining least significant bits and then the output of both stages is combined. Moreover, a calibration and correction approaches are provided for the multi-stage ADC.

14 Claims, 11 Drawing Sheets

(51) Int. Cl.
      *H03M 1/06*        (2006.01)
      *H03M 1/14*        (2006.01)
      *H04N 5/374*      (2011.01)
      *H03M 1/36*        (2006.01)
      *H03M 1/00*        (2006.01)
      *H03M 1/56*        (2006.01)
      *H03M 3/00*        (2006.01)

(52) U.S. Cl.
      CPC ............. *H03M 1/145* (2013.01); *H03M 3/46* (2013.01); *H04N 5/374* (2013.01); *H03M 1/00* (2013.01); *H03M 1/12* (2013.01); *H03M 1/123* (2013.01); *H03M 1/1225* (2013.01); *H03M 1/365* (2013.01); *H03M 1/56* (2013.01); *H03M 3/39* (2013.01)

(58) Field of Classification Search
      USPC ....... 341/156, 155, 157, 158, 159, 164, 165, 341/169, 139, 141
      See application file for complete search history.

(56) References Cited

U.S. PATENT DOCUMENTS

2012/0097839 A1     4/2012     Jung et al.

2013/0120180 A1*    5/2013     Kawahito .............. H04N 5/357
                                                                                               341/172

FOREIGN PATENT DOCUMENTS

| JP | H11308110 A | 11/1999 |
|---|---|---|
| JP | 2003298418 A | 10/2003 |
| WO | 9613903 | 5/1996 |

OTHER PUBLICATIONS

Ramesh Harjani et al: "FRC: A Method for Extending the Resolution of Nyquist Rate Converters Using Oversampling", IEEE Transactions on Circuits and Systems II: Analog and Digital Signal Processing, Institute of Electrical and Electronics Engineers Inc, 345 East 47 Street, New York, N.Y. 10017, USA, vol. 45, No. 4, Apr. 1998, XP011012806, ISSN: 1057-7130, figure 4.

Jansson C: "A High-Resolution, Compact, and Low-Power ADC Suitable for Array Implementation in Standard CMOS", IEEE Transactions on Circuits and Systems Part I: Regular Papers, IEEE Service Center, New York, NY, US, vol. 42, No. 11, Nov. 1995, pp. 904-912, XP000549478, ISSN: 1057-7122, DOI: 10.1109/81.477201, p. 905, left-hand column.

International Search Report and Written Opinion mailed Aug. 23, 2013 for PCT Application No. PCT/EP2013/066571.

Extended European Search Report (including the European search report and the European search opinion) mailed Jan. 11, 2013 for EPO Application No. 12179815.1.

Agah, Ali; Vleugels, Katelijn; Griffin, Peter B.; Ronaghi, Mostafa; Plummer, James D.; and Wooley, Bruce A., "A High-Resolution Low-Power Incrementa I ΣΔADC With Extended Range for Biosensor Arrays", IEEE Journal of Solid-State Circuits, US, IEEE, Jun. 2010, vol. 45, No. 6, pp. 1099-1110.

\* cited by examiner

TWO-STAGE ANALOG-TO-DIGITAL CONVERTER FOR HIGH-SPEED IMAGE SENSOR

CROSS-REFERENCE TO RELATED APPLICATION(S)

This application is a U.S. National Phase application of PCT application number PCT/EP2013/066571 having an International Filing Date of Aug. 7, 2013, which claims priority of European patent application 12179815.1 filed on Aug. 9, 2012, the disclosures of which are hereby incorporated by reference.

The invention relates to analog-to-digital conversion for converting an analog image signal to a digital signal. In particular, the present invention relates to analog-to-digital conversion particularly suitable for high-speed applications.

BACKGROUND OF THE INVENTION

Many popular consumer electronics applications such as cameras and mobile handsets as well as professional electronic applications such as video surveillance and monitoring employ complementary metal-oxide-semiconductor (CMOS) image sensors (CIS). Various applications pose different requirements on the spatial and temporal resolution. In general, as sensor resolution increases, the operation of the sensors in desired frame rates involves higher data conversion rates. CMOS image sensors typically comprise a pixel matrix and a readout circuit. The pixel matrix includes a plurality of CMOS pixel sensors organized in rows and columns of a matrix. In a CMOS pixel sensor, an input light brightness is converted to a corresponding analog electrical signal by, for instance, a pinned photodiode. The readout circuitry scans the pixel matrix and outputs a digital image signal that contains the scene information. Typically, the pixels are read by selecting each row of pixels successively. At the same time, the pixel signals are read from multiple columns of the selected row.

Traditionally, the readout circuitry has included of a Correlated Double Sampling (CDS) amplifier for computing the pixel signal and for amplifying it to the required level, and an output buffer for bringing the analog signal out of the sensor, where it is conditioned and digitized. The correlated double sampling removes noise by subtracting a noisy signal value (NS) and a dark level value (N) from the same pixel. The resulting signal value (S) serves then usually as a basis for the analog-digital conversion. Most of the recent implementations include the analog-to-digital conversion (ADC) on the chip. Accordingly, the CDS amplifier is often followed by an ADC block.

The reading out of the multiple columns may be parallelized, which is advantageous especially for the high-speed applications. On the other hand, parallelism requires more circuit components. For instance, in order to read out the pixels from all columns in parallel, for each column a Correlated Double Sampling (CDS), amplification and/or AD conversion circuit is to be provided. The level of parallelization may be selected with respect to the application and only some stages (such as CDS only or CDS and amplification) may be parallelized. Alternatively or in addition, the parallelization may only regard a subset of the columns in the selected row.

In many applications, as the speed requirements increase, the number of readout channels needs to be increased as well. Each readout channel then advantageously includes CDS amplifier and ADC. Theoretically, the achievable frame rate of a CIS linearly increases with the number of readout elements working in parallel. In fact, the readout elements can be seen as a single readout channel with effective speed boosted by the number of replicas. In practice, this parallelism can be increased as much as needed. Nowadays many CIS implementations employ a readout element per pixel column, so that such readout element is in charge of processing the signal coming from pixels in a single column. Moreover, parallelism can be increased further by implementing more than one readout element per pixel column. In such a case, a number of readout elements processes a number of pixels within the same column. This means that a plurality of rows is read out simultaneously. This technique has been proven useful for very high-speed CIS, giving rise to thousands of frames per second for resolutions around 1 mega pixel (Mp).

However, for ultra-high speed CIS, the increasing of the parallelism may require a prohibitively large amount of readout channels. These readout channels may then suffer from an extremely high power dissipation and silicon area occupation for their on-chip implementing. In these cases, improving the speed of the individual readout channel is mandatory to keep area and power consumption reasonably bounded.

SUMMARY OF THE INVENTION

Based on the above problems with the prior art, the aim of the present invention is to provide readout circuitry enabling a higher read-out speed while keeping the additional hardware costs as low as possible.

This is achieved by the subject matter of the independent claims.

Advantageous embodiments of the invention are subject to the dependent claims.

It is the particular approach of the present invention to reduce the amount of circuitry by providing the output of the first-stage ADC integrator to the input of the second-stage ADC after scaling it with a gain inversely proportional to the gain of the integrator.

According to a first aspect of the present invention, an analog to digital converter is provided for converting an analog signal form an image sensor to a digital value. The converter comprises: a first stage including a first analog to digital converter for obtaining a first number of bits of the digital value, the first analog to digital converter comprising an integrator with a first gain and a comparator for comparing the integrated signal with a first reference signal; an intermediate amplifier for multiplying the output of the integrator after conversion of the first number of bits in the first stage by a predetermined gain based on the first gain; and a second stage including a second analog to digital converter for obtaining a second number of bits of the digital value based on the signal input from the intermediate amplifier.

Preferably, the predetermined gain is an inverse of the first gain of the integrator. This provides the advantage of avoiding the saturation.

Preferably, the first analog to digital converter is a first-order incremental analog to digital converter further including a digital counter for accumulating the decisions of the comparator. However, the present invention is not limited thereto and the first ADC may also be a higher-order incremental ADC, including single-loop or MASH (cascade) sigma-delta topologies.

Advantageously, the second analog to digital converter is a ramp analog to digital converter that comprises a comparator for comparing the signal input to the second analog to digital converter with a reference analog ramp signal, and a digital register for storing the digital value corresponding to the time period in which the analog ramp signal crosses the input signal.

In particular, the ADC may further comprise an adding means for adding the converted signal output from the first analog to digital converter according and scaled to the output from the second analog to digital converter.

The analog to digital converter may further comprise a gain correction means for compensating a mismatch between the reference signals input to the first stage and to the second stage. The gain correction means preferably includes: a first amplifier for scaling the signal output from the first analog to digital converter by a first gain which is determined based on the digital signals obtained by conversion through the first and second stage of the analog to digital converter with a respective different settings of the number of comparisons performed by the comparator, and/or a second amplifier for scaling the signal output from the second analog to digital converter by a second gain which is determined based on the digital signals obtained by conversion through the first and second stage of the analog to digital converter with a respective different settings of the number of comparisons performed by the comparator. In particular, the two gains may be inverse of each other.

The analog to digital converter may further comprise an offset correction means for compensating an offset due to a mismatch between the reference signals input to the first stage and to the second stage, the offset correction means including an offset subtractor for subtracting an offset from the output of the second analog to digital converter.

It is noted that the offset correction means may precede the gain correction means in the path of the second-stage output and thus, the gain correction may be applied after the offset correction.

The integrator of the first analog to digital converter is advantageously implemented by means of a switched capacitor operational transconductance amplifier. However, the present invention is not limited thereto and other implementations are possible as will be apparent to those skilled in the art.

In accordance with another aspect of the present invention a method is provided for calibrating and correcting the two-stage analog to digital converter. The method comprises the steps of determining a first calibration output signal by converting a first predefined signal by employing a first number of comparisons by the comparator, determining a second calibration output signal by converting the first predefined signal by employing a second number of comparisons by the comparator, determining a correction gain based on the determined first and second calibration output signal by calculating based thereon a ration between the reference signals input to the first and the second stage analog to digital converters, and correcting the signal output by the first and/or the second stage by the determined correction gain.

Alternatively or in addition a method is provided for calibrating and correcting the two-stage analog to digital converter with the steps of: determining an offset by converting with the two-stage analog to digital converter a zero input signal, and subtracting the determined offset from the signal output from the second analog to digital converter.

The calibration method may combine the benefits of both above methods and correct both the gain and the offset. Accordingly, the method comprise the steps of determining an offset by converting with the two-stage analog to digital converter a zero input signal with the number of comparator decisions set to the first number of comparisons, subtracting the determined offset from the signal output from the second analog to digital converter, and the step of correcting the signal output by the second stage and already corrected by the step of subtracting the determined offset.

In accordance with another aspect of the present invention, an integrated circuit is provided for embodying the analog to digital converter as described above.

Preferably, the integrated circuit is a CIS further comprising an image sensor formed by a matrix of pixels, each pixel including a photo-electric means for converting the light into an electric signal, a selection circuit for sequentially selecting a row of pixels, and a column readout circuit for reading out in parallel a plurality of the pixels from different columns of the selected pixel row. It is noted that the sequential selection may include parallel selecting of a plurality of rows. There may be more than one readout channel per column, i.e. a plurality of rows (as many rows as is the number of channels stacked per column) may be converted in parallel.

Advantageously, the readout circuit includes a plurality of analog to digital converters as described above operating in parallel. In particular, the readout circuit further comprises a correlated double sampling circuit of which the output is provided to the analog to digital converter.

Figure 1B:
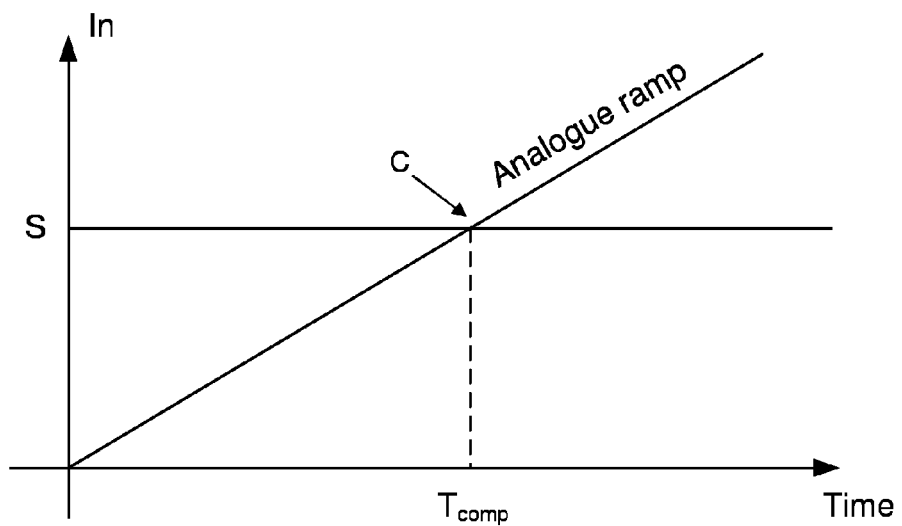
Figure 2:
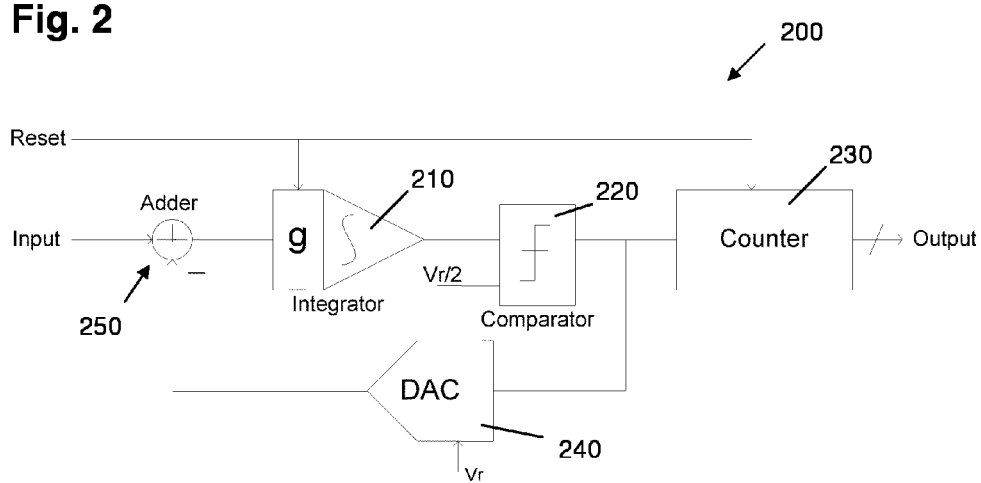
Figure 3:
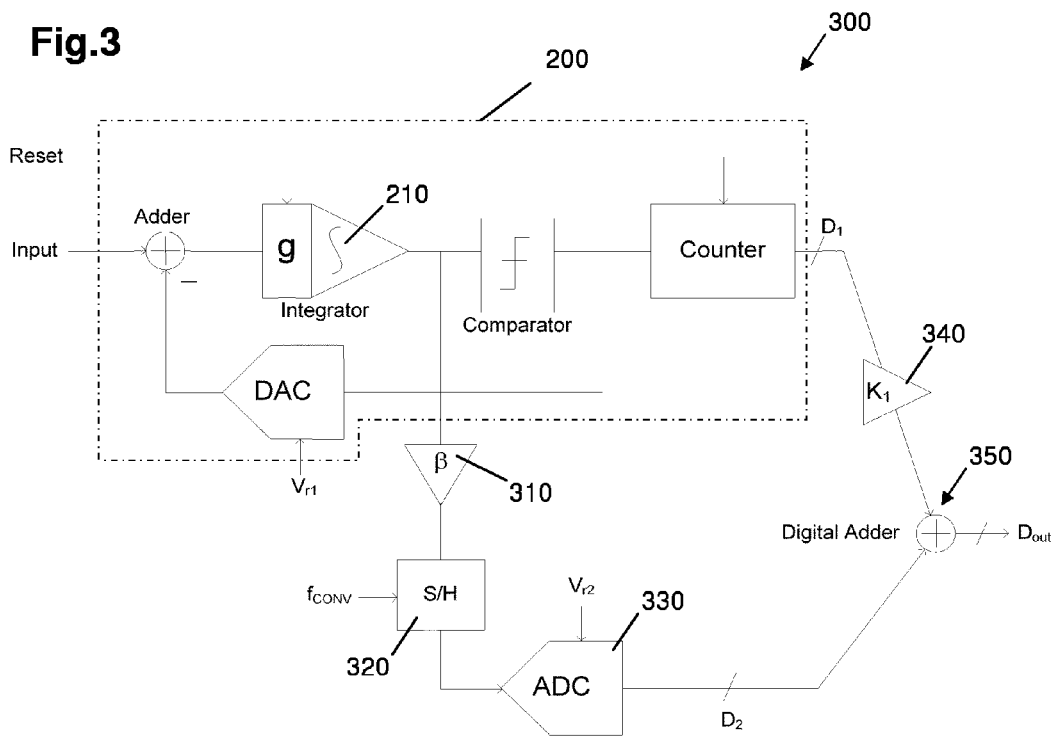
Figure 4:
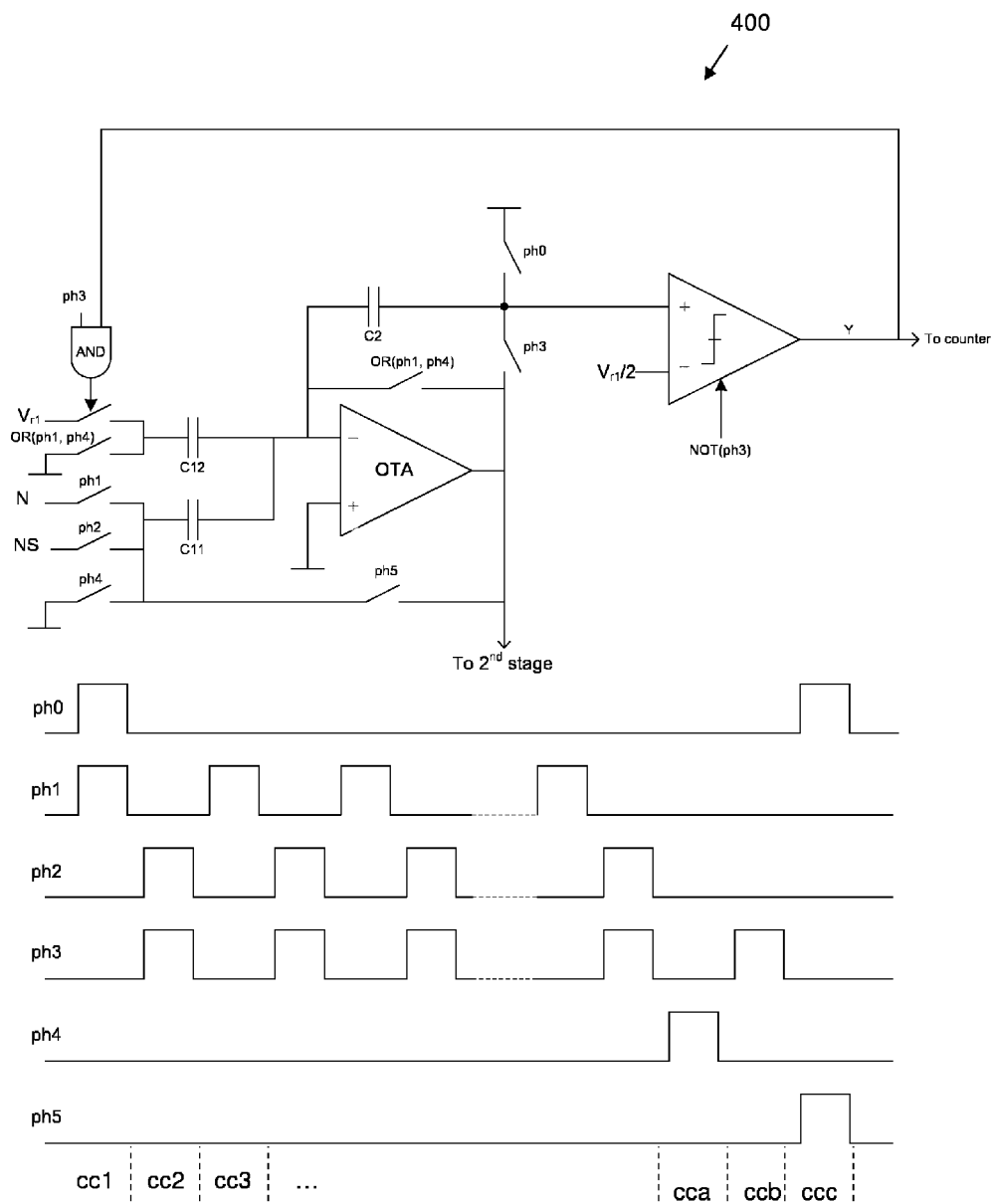
Figure 5:
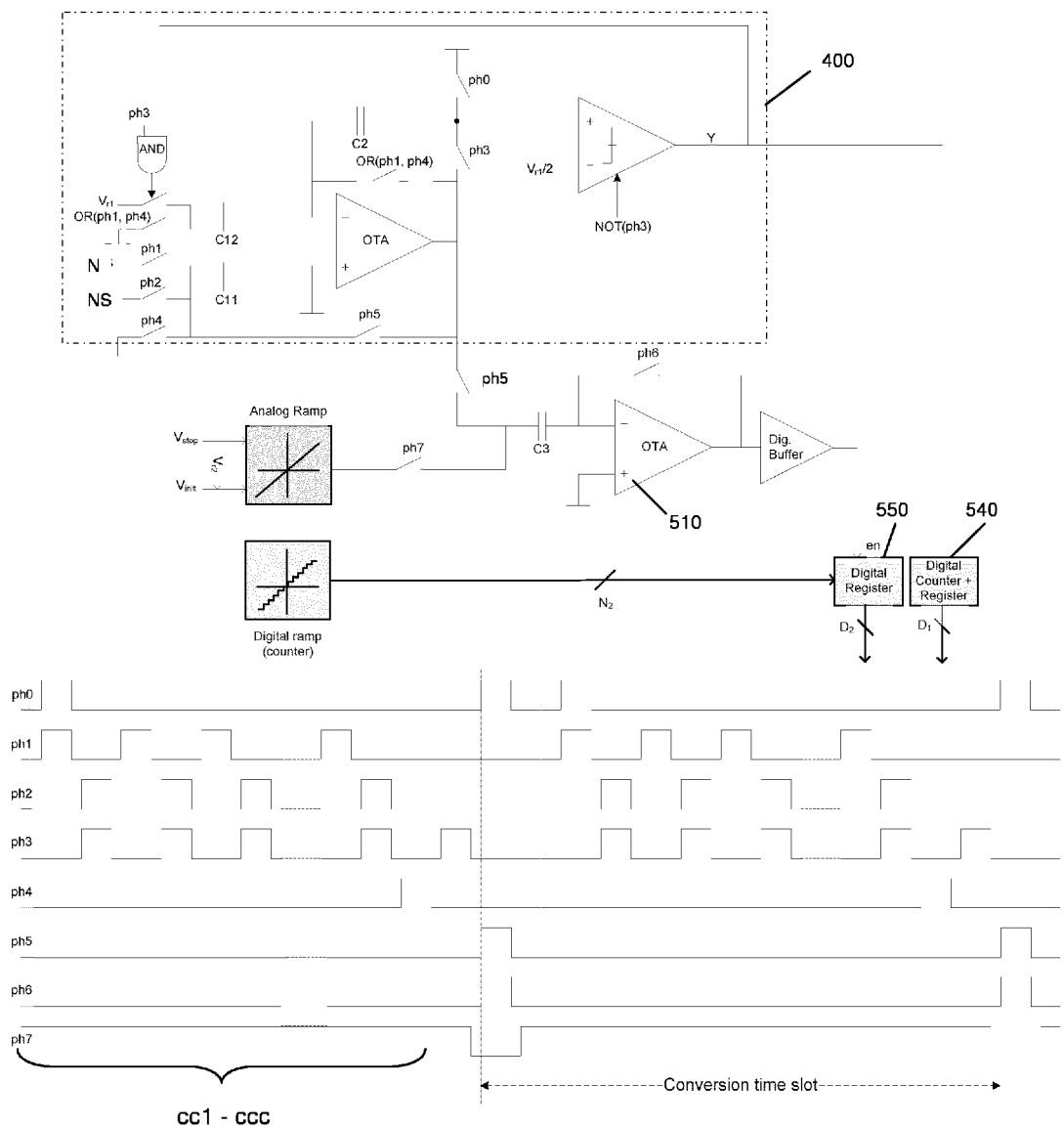
Figure 6:
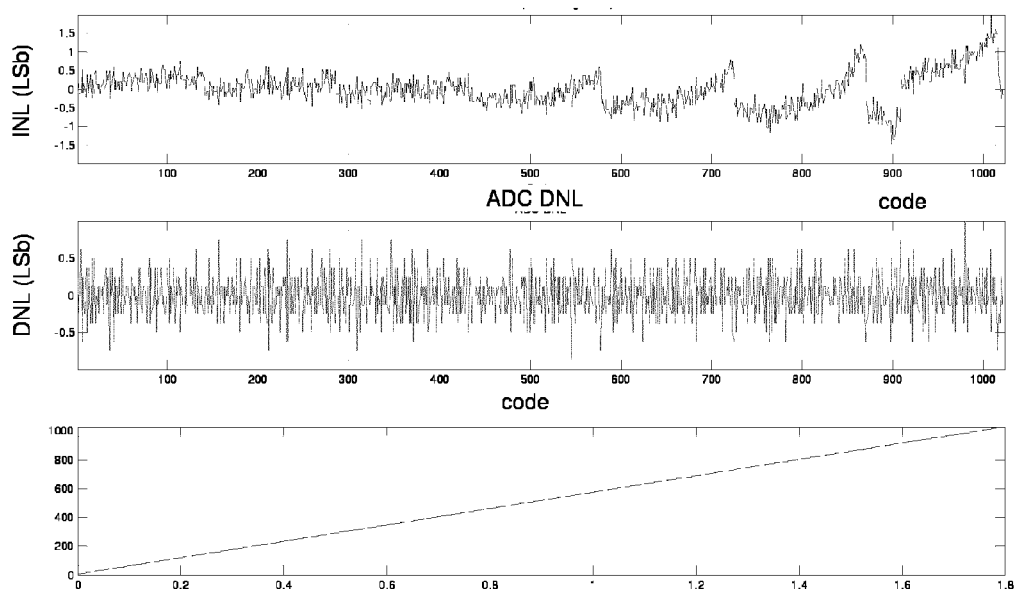
Figure 7:
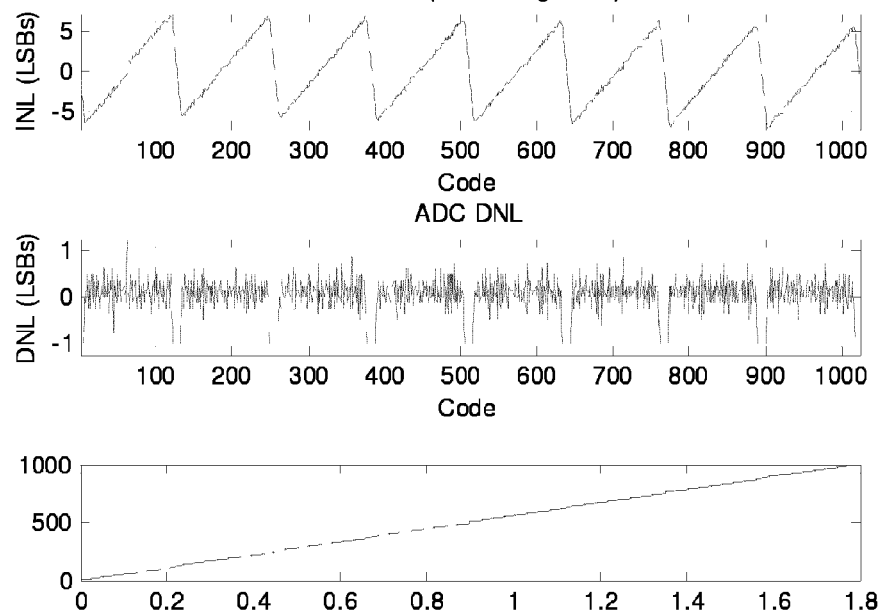
Figure 8:
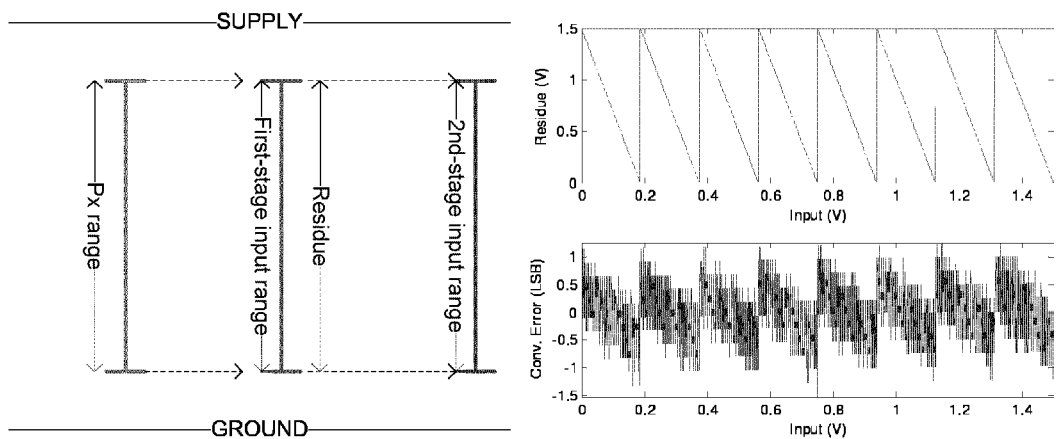
Figure 9:
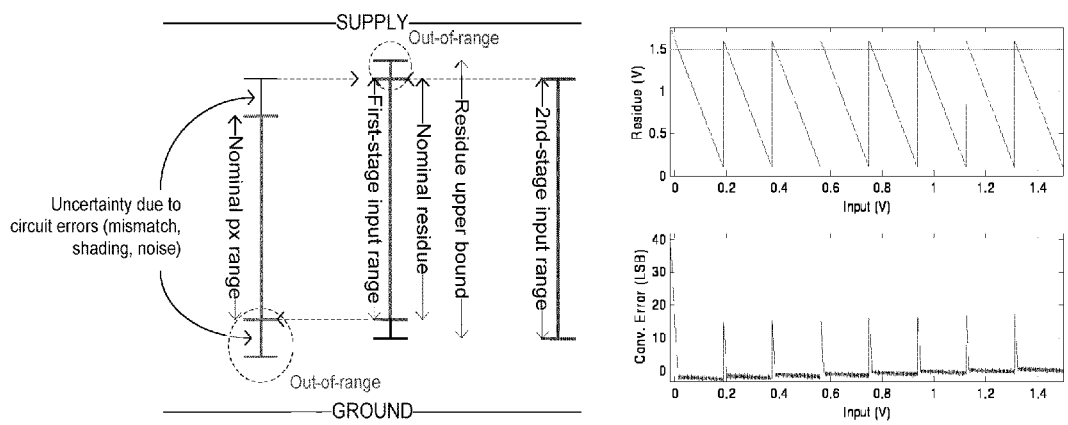
Figure 10:
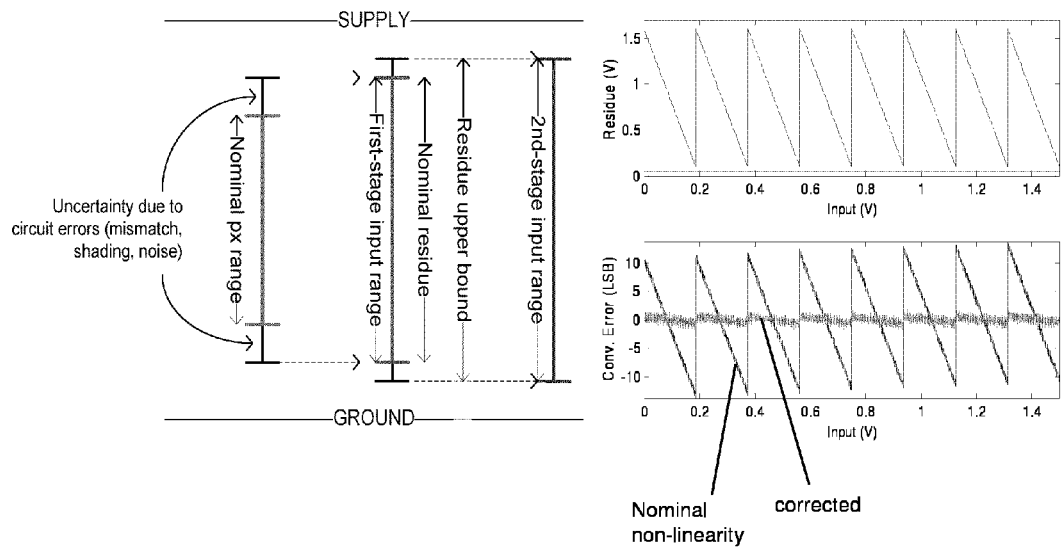
Figure 11:
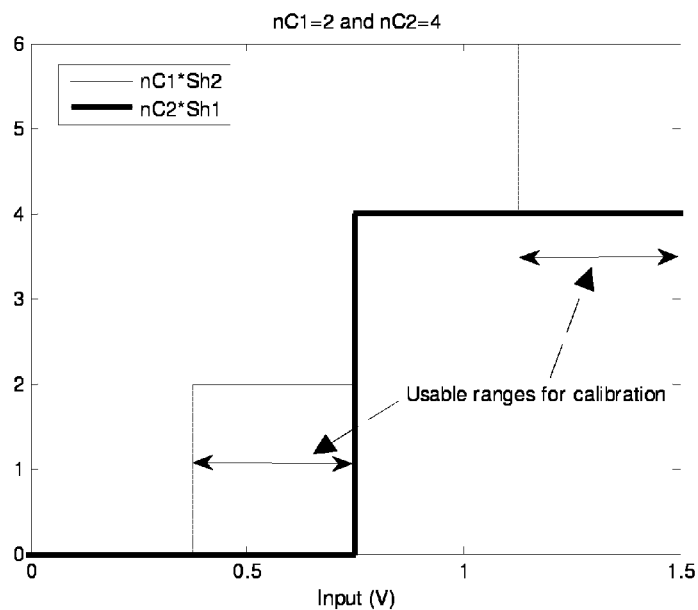
Figure 12:
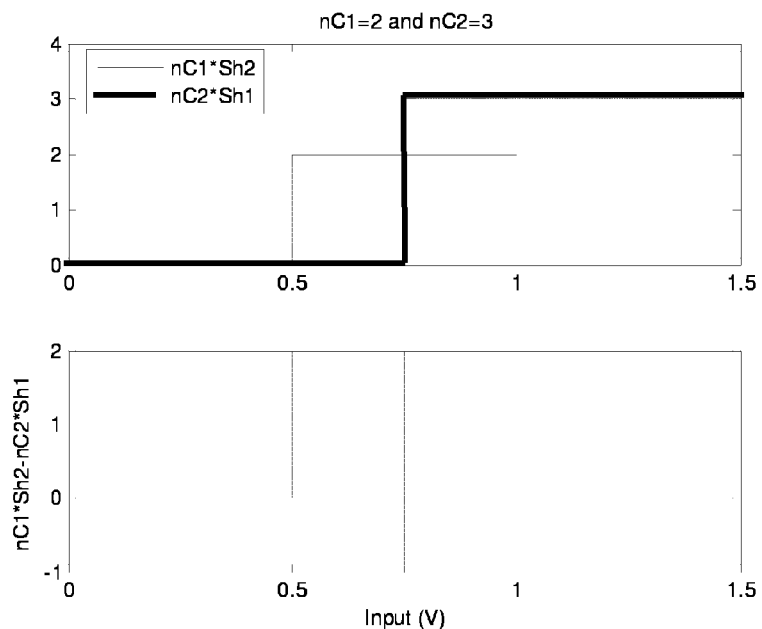
Figure 13:
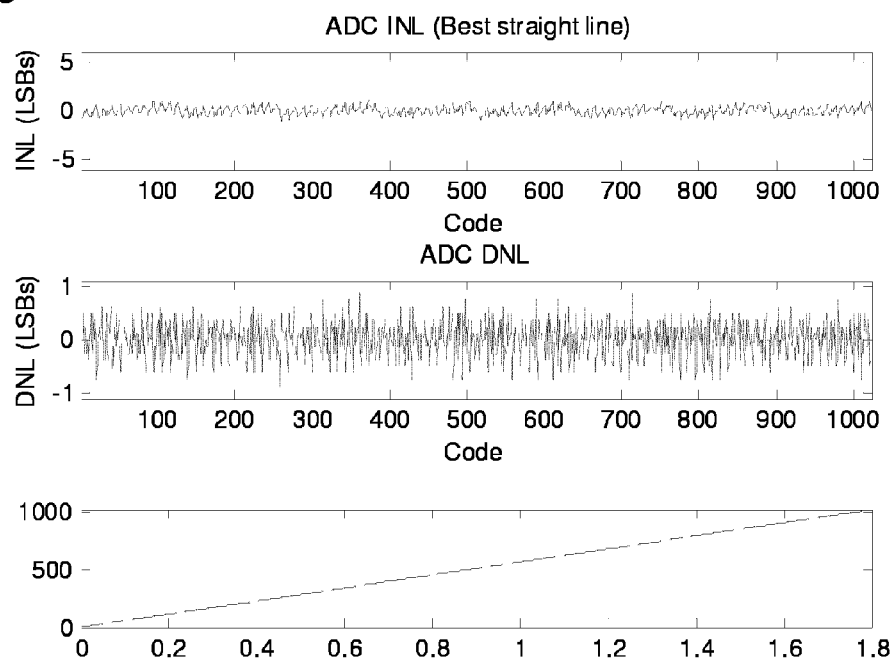
Figure 14:
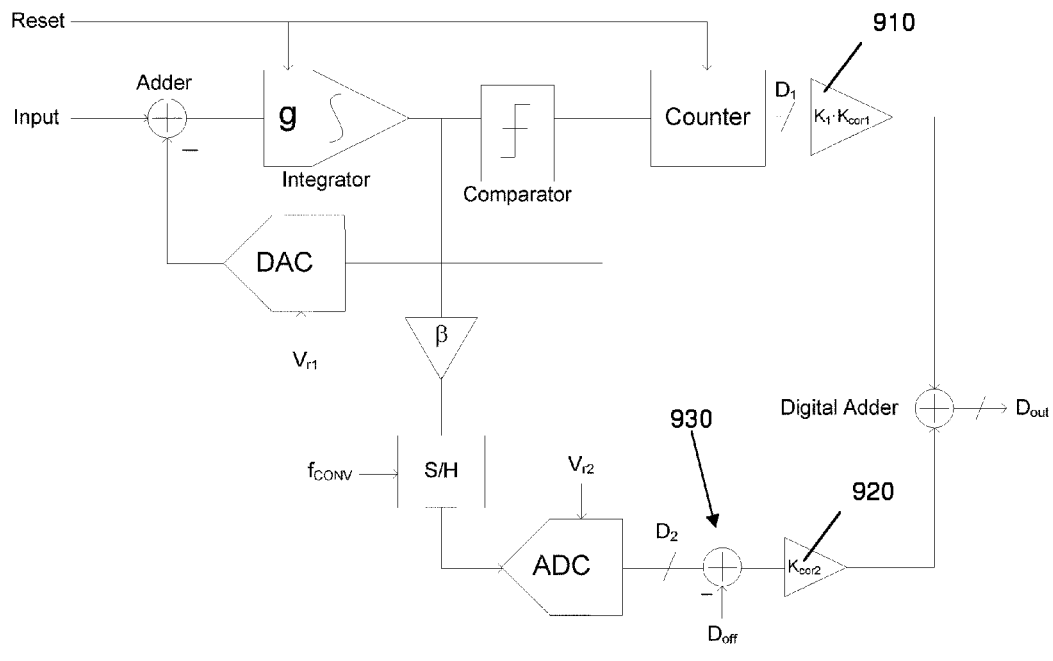
Figure 15:
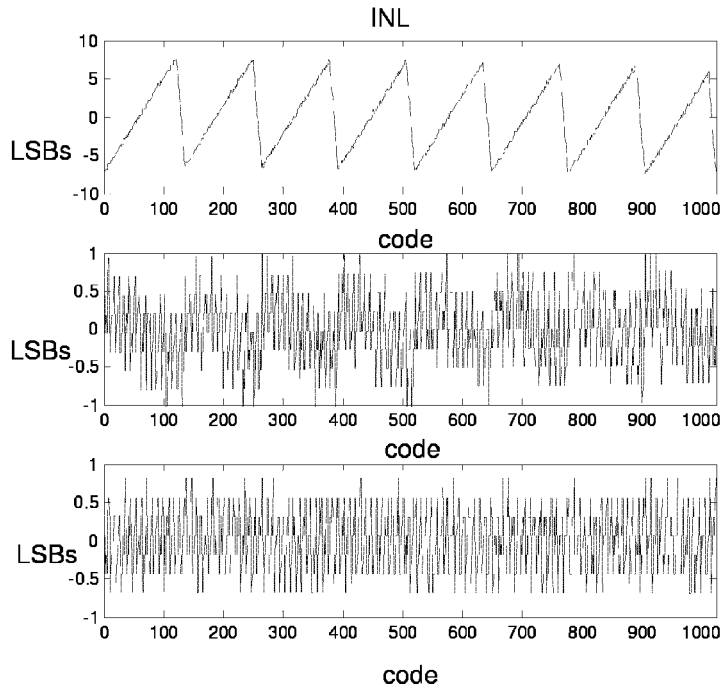
Figure 16:
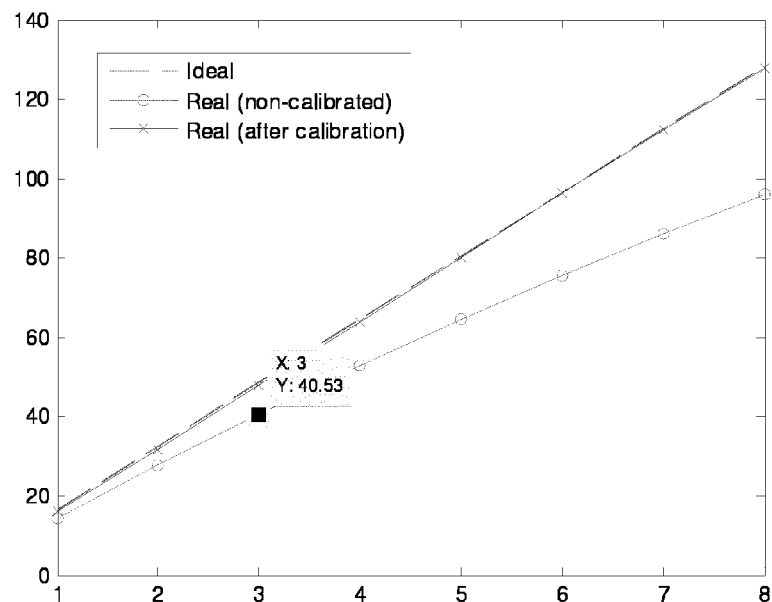
Figure 17:
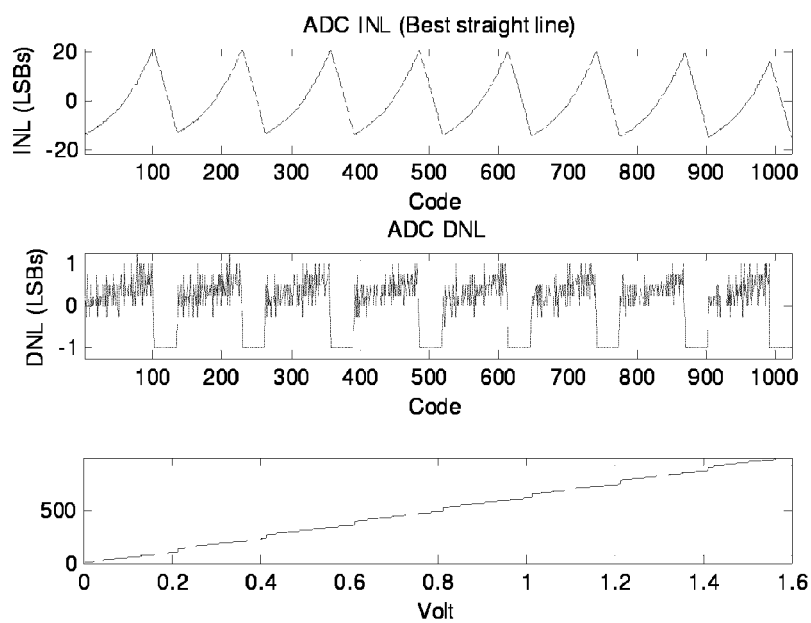
Figure 18:
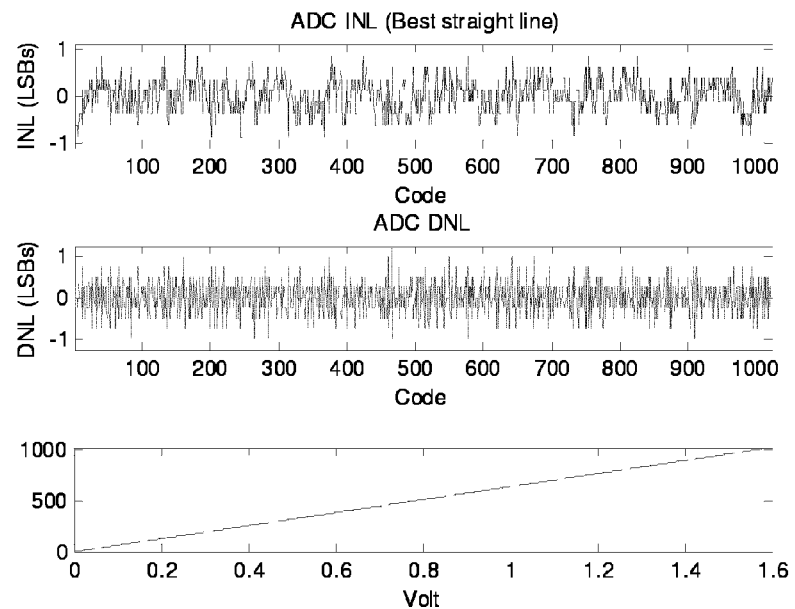
Figure 19:
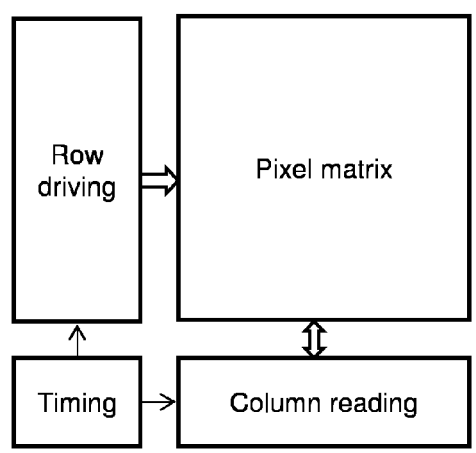

The above and other objects and features of the present invention will become more apparent from the following description and preferred embodiments given in conjunction with the accompanying drawings, in which:

FIG. 1 is a block diagram illustrating a single ramp analog-to-digital converter, FIG. 1A is a graph diagram illustrating the operation of the single ramp analog-to-digital converter, FIG. 2 is a circuit diagram illustrating an example of an incremental analog-to-digital converter, FIG. 3 is a circuit diagram illustrating an example of a two-stage analog-to-digital converter in accordance with an embodiment of the present invention, FIG. 4 is a circuit diagram illustrating details of the first stage of the exemplary two-stage analog-to-digital converter together with the circuit's switch timing, FIG. 5 is a schematic drawing illustrating further detail of the second stage of the exemplary two-stage analog-to-digital converter together with the circuit's switch timing, FIG. 6 is a drawing showing graphs illustrating the results, in terms of INL, DNL and transfer curves, of the two-stage ADC assuming that the reference voltages for the two stages are perfectly matched, FIG. 7 is a drawing showing graphs illustrating the non-linearities resulting from reference voltages of the respective first and second ADC stages mismatched by 10%, FIG. 8 is a drawing illustrating the ideal matching of the signal range, the input signal of the first stage and the second stage, FIG. 9 is a drawing illustrating consequences of circuit errors leading to high conversion errors and a loss of information due to saturation, FIG. 10 is a drawing illustrating correction of the input signal leading to reduction of the conversion error, FIG. 11 is a graph representing the range of input voltages for which the inequality $n_{C1}S_{h2} \neq n_{C2}S_{h1}$ holds for the setting of $n_{C1}=2$ and $n_{C2}=4$, FIG. 12 is a graph representing the range of input voltages for which the inequality $n_{C1}S_{h2} \neq n_{C2}S_{h1}$ holds for the setting of $n_{C1}=2$ and $n_{C2}=3$, FIG. 13 is a drawing showing graphs illustrating the results of the calibration and correction approach according to an embodiment of the present invention applied to the 10%-mismatched reference voltages example of FIG. 7, FIG. 14 is a circuit diagram illustrating implementation of the correction procedure according to an embodiment of the invention, FIG. 15 is a drawing showing graphs illustrating the results of calibration and correction approach according to an embodiment of the present invention applied to 12.5% mismatched reference voltages, FIG. 16 is a graph showing the second stage static characteristic including gain and offset errors and 10% second order non-linearity and the result of calibration, FIG. 17 is a graph illustrating the non-linearity before correction using the alternative calibration method, FIG. 18 is a graph showing the non-linearity after correction using the alternative calibration method, and FIG. 19 is a schematic drawing illustrating functional blocks of an integrated circuit in accordance with an embodiment of the invention.

DETAILED DESCRIPTION OF THE INVENTION

Among the blocks of the readout channel, the analog to digital conversion (ADC) takes a substantial part of the area and power dissipation, especially when the required resolution (bit depth) is high. Currently, 8 to 10 bits are common for CIS. However, for some applications, bit depths of 12 to 14 bits are being adopted. Accordingly, it is desirable to provide analog to digital conversion circuitry which would enable higher resolutions in terms of bits per sample and, at the same time, enable an area and power efficient implementation.

For implementing the ADC in parallel for a plurality of columns, integrating ADC topologies have been often used. In particular, ramp ADC are advantageous for CIS with a column-level readout parallelism. The amount of circuitry necessary for a ramp ADC per column is rather small, thus making it compatible with very low pixel pitch (distance of the pixels on an image sensor), which enables higher spatial resolutions of the CIS.

An example of a single ramp analog to digital converter 100 is shown in FIG. 1A. In particular, the single ramp ADC 100 includes a comparator 120 and a register 140. The comparator 120 has on its respective inputs an "analog ramp" signal 110 and a signal S, of which the value is to be digitalized. The output of the comparator 120 controls the register 140. In particular, the comparator generates a signal ("en" in FIG. 1A) when the analog ramp (integrated signal) exceeds the signal value. The register 140 is input a "digital ramp" 130, which may correspond to a digital counter. Upon receiving a signal from the comparator 120, the register 140 outputs the digital ramp count stored.

The function of the single ramp ADC 100 is further illustrated in FIG. 1B. The conversion begins with the analog ramp 110 starting from the lower limit of the analog signal (S) range at the same time at which the digital ramp 130 (usually a digital counter) starts. Both ramps are synchronized in such a manner that they both cover the full signal range simultaneously. Under this condition, the time instant $T_{comp}$ in which the analog ramp crosses the analog input is proportional to the value of the analog signal. The digital value is coded by means of $T_{comp}$ as the number of cycles of a clock reference. The crossing point is shown in FIG. 1B as "C". Accordingly, also the current value of the counter stored in the register 140 is proportional to the value of the analog signal S.

As stated above, a single-ramp ADC is preferred for column parallel-conversion, due to its small amount of local circuitry. This architecture is especially suited for fully-parallel implementations since the only circuitry needed for each readout channel is one comparator 120 and one register 140 to store the digital data. Typically, one channel coincides with one column of the pixel matrix. The analog ramp signal 110 constitutes a reference signal and is common for all columns. The same applies to the digital ramp 130.

The main drawback of the ramp ADCs is that they are rather slow. The number of clock cycles required to digitize the image signal with a B-bit resolution is proportional to 2 to power B ($2^B$) for a single-ramp converter, or to $2^{B+1}$ for the double-ramp type. The double-ramp converter ramps up as shown above and then ramps down again. It is more precise than the single-ramp converter since it suppresses the dependency on the integration constant and the clock period fluctuations. Accordingly, 10-bit resolution (bit depth) would require 1024 clock cycles to obtain a single digitized data with a single-ramp ADC and 2048 cycles with a double-ramp ADC. This may be enough for CIS of low or moderate speed. However, it will become too much as the speed and/or the resolution requirements increase.

In order to cope with this limitation, other ADC topologies have been proposed and used. For example, per-column sigma-delta ADC, SAR (successive approximation register), and algorithmic ADCs are used among others. An overview of the current ADC approaches is provided, for instance, in M. F. Snoeij et al., "*Multiple-Ramp Column-Parallel ADC Architectures for CMOS Image Sensors*", IEEE JSSC, Vol 42:12, pp. 2968-2977, December 2007, which is incorporated herein by reference. In all cases, the price to pay for a faster ADC is an increase in circuitry and hence in silicon area.

In order to achieve a higher area-efficiency for the high-speed analog-to-digital conversion, two-stage ADC has been designed. The two-stage ADC performs the conversion in two stages corresponding to two sub-ADCs. In particular, the first stage solves a first number of Most-Significant Bits (MSB) and the second stage solves the remaining second number of bits, which are the Least-Significant Bits (LSB) until the required resolution is achieved. The speed of each sub-ADC can be made higher, within a reduced area, since the local resolution of the sub-ADC is lower. Moreover, when run in a pipe-line manner, both sub-ADCs may work simultaneously over consecutive data samples. The main practical problem of the two-stage ADCs is that their correct performance requires a good matching between the characteristics of the two stages. In particular, differences between the two sub-ADC input-output curves should be avoided. Especially, mismatches in offset, gain and non-linearity errors between the two stages may substantially impact the overall linearity of the ADC. In CIS, such non-linearity may induce visible artifacts in the captured images.

The aim of the present invention is to enable development of a fast two-stage ADC that is robust against circuit imperfections, and possibly with an efficient self-calibration and/or correction mechanisms that helps to mitigate the non-linearities.

According to an embodiment of the present invention a fast two-stage ADC is provided. The ADC of the present invention connects two stages of a multiple-stage ADC in an advantageous way, namely by providing to the second stage the output of the integrator employed in the first stage and scaled with a gain proportional to the gain of the integrator.

A two-stage ADC in accordance with an embodiment of the invention comprises in its first stage an incremental ADC. An example of such an incremental ADC is shown in FIG. 2. FIG. 2 shows a first-order incremental ADC. However, it is noted that the present invention is not limited thereto and that high-order incremental topologies can be used instead. A first-order incremental ADC is advantageous for minimizing the circuitry content. However, depending on the requirements of the application, higher-order incremental ADCs may be employed.

An incremental ADC 200 comprises an integrator 210 with gain g and a comparator 220. The integrator 210 accumulates at each clock cycle the difference between the input signal "Input" and a feed-back signal. FIG. 2 schematically illustrates forming of the difference signal by the "Adder" 250. The comparator 220 compares the output of the integrator 210 with a voltage reference $V_r/2$. If the comparator output is high (logical 1), a reference voltage $V_r$ is output and fed back for indicating the logical 1. Otherwise, if the comparator output is low (logical 0), the ground voltage is output and fed back for indicating the logical 0. During each conversion, the output of the comparator (logic 0 or logic 1) is accumulated digitally in the counter 230. Thus, the output code "Output" is formed as the sum of the consecutive comparator decisions. At the beginning of each conversion, both the integrator and the digital accumulator are reset, for instance, by the control line "Reset" shown in FIG. 2.

For example, given a number 4 of consecutive comparisons to be performed, the possible digital outputs may be mapped to the converted digital value as follows:

The decisions of the comparator 0000 are mapped to a digital code "0",

The decisions of the comparator 1000 or 0100 or 0010 or 0001 are mapped to a digital code "1", The decisions of the comparator 1100 or 0110 or 0011 are mapped to a digital code The decisions of the comparator 1110 or 0111 are mapped to a digital code "3", The decisions of the comparator 1111 are mapped to a digital code "4".

As can be seen from the above, the value of the analog signal is coded by means of the number of times with comparison result being logical 1 among the predefined number of consecutive comparisons. In the above example, the four consecutive comparisons may lead to 5 different numbers of equal decisions. This allows resolving five different digital levels. In general, the number of digital levels obtained with a number of consecutive comparisons, $n_C$, is $n_C+1$, including zero and 1 to $n_C$ logical-one decisions. Accordingly, the corresponding ADC resolution in bits (bit depth) equals $\log_2(n_C+1)$.

A second stage ADC then follows the first stage. In order to resolve further bits of the analog signal value based on the output of the first stage (conversion result) the reference levels are adjusted for the second-stage ADC. In order to implement the two-stage ADC, a sample- and hold circuit is typically used at the input of the second stage. The second stage has as an input the difference between the input signal and the DAC converted result of the first stage. This is typically further amplified. In other words, the input of the second stage is the first-stage conversion residue (i.e., the ADC input minus the DAC converted result of the first stage), once amplified. In order to enable parallel processing, this concept is "spread" in time—the residue is being created while the first stage conversion is being performed.

According to this embodiment of the present invention, an incremental ADC 200 is combined with a second-stage sub-ADC to form a two-stage ADC 300 as illustrated in FIG. 3. In particular, in order to reduce the chip area necessary, rather than back-converting the result of the first stage-ADC to analog signal and subtracting it from the input signal, the output of the integrator 210 at the end of the conversion is multiplied by a factor β by intermediate amplifier 310, and inputted to the second sub-ADC. At the end of the conversion, the output of the integrator 210 corresponds to the remaining not yet converted portion of the input signal, i.e. to the least significant bits.

It is noted that the second stage sub-ADC 330 may be of any type such as ramp ADC, incremental or sigma-delta ADC, or any other type. The second stage is also not necessarily the last stage and, in general it is possible that more stages are cascaded. The choice of the appropriate second-stage ADC may be performed according to the application requirements. For instance, the second-stage ADC may be similar to the first stage, i.e. the second stage may also be an incremental ADC or whatever that better fits the intended application. For a CMOS Image Sensor with a per-column parallel readout path, it is desirable to minimize the circuitry portion. Thus, an integrating ramp ADC as described above with reference to FIGS. 1A and 1B may be advantageously employed as the second stage.

As can be seen from FIG. 3, according to this embodiment of the present invention, the first output code $D_1$ of the first sub-ADC 200 is scaled 340 by a constant $K_1$ and then input to an adder 350 ("digital adder") where it is summed up with the second output code $D_2$ of the second sub-ADC 330 to form the output digital word $D_{out}$. It is noted that the second-stage ADC 330 also includes an input of a reference voltage $V_{r2}$ and similarly, the DAC 240 includes an input reference voltage $V_1$. Beneficially, these voltages are equal. Moreover, FIG. 3 also shows an input $f_{conv}$ to the sample-and-hold circuit 320. This input is a timing input for controlling the sample and hold circuit as will be exemplified below.

In order to minimize the per-column circuitry, the later operations such as the sub-ADC scaling and/or the addition of the two digital sub-codes (the first digital code $D_1$ and the second digital code $D_2$) can be implemented aside from the ADC column circuitry, for example in the serialization block that builds the output data path, or they can even be implemented off-chip.

In the following, a more detailed exemplary embodiment of the present invention will be described with reference to FIGS. 4 and 5.

FIG. 4 shows an exemplary implementation of the first stage of the ADC. The digital counter functionally corresponding to counter 240 in FIG. 2 is not shown. The first-stage ADC comprises a Switched-Capacitor (SC) integrator and a latched comparator 420. The switched-capacitor integrator is implemented by means of an operational transductance (transconductance) amplifier (OTA). The OTA is a voltage controlled current source, i.e. it receives an input voltage and provides an output current, for instance to charge the capacitor. A switched-capacitor circuit is a circuit that performs transfers of charges into and out of a capacitor upon controlling a switch as will be described below.

The lower part of FIG. 4 shows the clock phases for operation of the switches ph0 to ph5. The operation of the first stage ADC 400 includes the following steps.

At the beginning of the conversion time-slot, when the switches ph0 and ph1 are active (switched on) simultaneously, the integrator is reset. This is shown in the lower part of FIG. 4 in the timing diagram by the first cycle interval (phase "cc1"), in which ph0 and ph1 signal exhibit a pulse while the remaining signals ph2 to ph5 do not exhibit an impulse for switching on the corresponding switches. In particular, the OTA is held in a unity-gain feedback configuration, meaning that the switch "OR (ph1, ph4)" is switched on since ph1 is switched on and ph4 is switched off. The term "OR (ph1, ph4)" means that the switch is on when at least one of ph1 and ph4 is switched on. Accordingly, the capacitor $C_{12}$ and $C_2$ are pre-charged at an intermediate voltage called $V_{cm}$. At the same time, the reference pixel level N is stored in capacitor $C_{11}$. It is noted that all capacitors also store the OTA offset. This auto-zero technique, subtracting the values measured for N and the signal pixel values (levels) NS allows getting rid of the OTA offset effect. It also attenuates the OTA low-frequency 1/f noise. Accordingly, in the first phase, the switched capacitor $C_2$ of the integrator is precharged.

In the next intervals (clock cycles), the switches ph2 and ph3 (phase "cc2") are activated alternately with the ph1 switch (phase "cc3") in a non-overlapping sequence during a predefined number of clock cycles. In each cycle, the pixel reference output N and the signal output NS are alternately sampled at the capacitor $C_{11}$ and the difference between the pixel reference output and the signal output (N-NS) is accumulated in the capacitor $C_2$ with a $C_{11}/C_2$ gain. Capacitor $C_2$ is switched on (connected) across the OTA during the on-phase of the switch ph3.

At the end of each clock cycle, the comparator 420 is latched by the negated phase of ph3, i.e. when the switch ph3 is switched off, and makes a decision, Y, about the sign of the integrator output minus a voltage reference $V_{r1}/2$. This corresponds to the operation of the comparator 220 as described above with reference to FIGS. 2 and 3. This decision, which is accumulated in the counter 240 (not shown in FIG. 4) to form the output of the first-stage, is fed back to make capacitor $C_{12}$ sample either ground or $-V_{r1}$. This is achieved by operating the switch by AND (Y, ph3), meaning that the voltage $-V_{r1}$ is switched on when both Y and ph3 have the "high" value, i.e. Y has the value of logical 1 and the signal ph3 exhibits a pulse corresponding to value of logical 1. The sampled voltage, either ground or $-V_{r1}$ is also accumulated in $C_2$ with a gain equal to $C_{12}/C_2$. Thus, after the n-th clock cycle, the integrator output $v_{o,n}$ becomes $$v_{o,n} = v_{o,n-1} + \frac{C_{11}}{C_2}V_s - \frac{C_{12}}{C_2}V_{r1}Y_{n-1}$$

wherein $v_{o,n-1}$ and $Y_{n-1}$ denote the integrator and comparator outputs, respectively, at the end of the previous clock cycle, and $V_S$=N-NS is the offset-compensated pixel signal. This operation is repeated a number of times. The voltage $V_{r1}$ is a first reference voltage. In this example it is assumed for simplicity and for compliance with FIG. 3 that $C_{11}/C_2=C_{12}/C_2=g$. However, it is noted that in general, this condition does not have to be strictly fulfilled.

In the next clock cycle (phase "cca") of the timing diagram in the lower part of FIG. 4, the switch ph4 is activated so that the capacitors $C_{11}$ and $C_{12}$ are reset. During the ph4 "on" phase, the pixel output is not sampled. At the following phase "ccb" the ph3 switch is on and the last comparator decision made during the previous clock cycle is fed back. At that time, the voltage $v_{o,nc}$ stored in $C_2$ is given by $$v_{o,nc} = n_c \frac{C_{11}}{C_2}V_s - \frac{C_{12}}{C_2}V_{r1}\sum_{i=0}^{n_c} Y_i$$

wherein $n_C$ denotes the number of comparisons of the first-stage ADC. Assuming that $C_{11}=C_{12}$, it can be shown that such a voltage $v_{o,nc}$ is equal or lower than $C_{11}/C_2 \cdot V_{r1}$ for an arbitrary input in the closed range of [0, $V_{r1}$] so that, when amplified by $C_2/C_{11}$, it is still within said range.

The final step (phase "ccc") implements the amplification described above. For this purpose, the bottom plate of the capacitor $C_2$ is grounded by activating again ph0, while the capacitor $C_{11}$ is switched across the OTA by means of the switch ph5. In this manner, the charge stored in $C_2$ is transferred back to $C_{11}$, thus achieving a $C_2/C_{11}$ voltage amplification. Accordingly, the gain factor β that precedes the second sub-ADC in FIG. 3 is in this exemplary embodiment of the present invention implemented by re-using the first sub-ADC circuitry. This enables saving the silicon area and power consumption. Furthermore, it is ensured by this construction that β·g=1.

FIG. 5 illustrates the first-stage ADC 400 together with a second-stage ADC. As discussed above, a single-ramp ADC 100 is advantageous for a high-speed column-parallel conversion since it requires a rather low amount of circuitry components. FIG. 5 exemplifies the details of such an ADC second stage in connection with the first-stage ADC 400 as described with reference to FIG. 4 above.

The left lower part of FIG. 5 shows the timing (cc1-ccc) of the first stage as shown in FIG. 4. The right lower pat of FIG. 5 shows the conversion timing performed at the second stage. In particular, phases ph6 and ph7 are controlling the second stage sub-ADC and are repeated in all conversion slots. The same applies to phases ph0 to ph5. Although it may seem that the operation of the two stages is sequenced in time, this is only true for a given ADC input sample. The two stages work all the time in a pipelined manner.

The ramp reaches the full signal range when the digital count gets to its maximum value, i.e. when $$V_{r2} = m \cdot 2^{N_2} \cdot T_{clk}$$

Here, $T_{clk}$ denotes the length of the cycle, m is a predefined constant and $N_2$ denotes the number of bits delivered (converted) by the second-stage ADC. In other words, the ramp may be represented as a staircase, in which each step height value is m*$T_{Clk}$. In practice, factor m may be used to apply certain gain to the conversion by making the analog ramp "go slower" than the digital one.

During a normal operation, the digital ramp is latched (output from the digital register 550) when the comparator 510 tilts, which indicates that the analog ramp value and the analog input value cross, i.e. are equal. At this instant:

$$V_{in2} = m \cdot D_2 \cdot T_{clk} \Rightarrow D_2 = \frac{V_{in2}}{m \cdot T_{clk}} \Rightarrow D_2 = \frac{V_{in2}}{\frac{V_{r2}}{2^N \cdot T_{clk}} \cdot T_{clk}} \Rightarrow D_2 = \frac{V_{in2}}{V_{r2}} \cdot 2^{N_2}$$

As shown in FIG. 3, the output of the two-stage ADC is formed by addition of the first-stage output and the second-stage output once amplified by a factor $K_1$:

$$D_{out} = K_1 D_1 + D_2$$

$$= K_1 \sum_{i=0}^{n_C} Y_i + \frac{V_{in2}}{V_{r2}} \cdot 2^{N_2}$$

$$= K_1 \sum_{i=0}^{n_C} Y_i + \frac{n_C V_S - V_{r1} \sum_{i=0}^{n_C} Y_i}{V_{r2}} \cdot 2^{N_2}$$

With $K_1 = 2^{N_2}$, and $V_{r1} = V_{r2} = V_R$, it follows:

$$D_{out} = \frac{n_C V_S}{V_R} \cdot 2^{N_2} = \frac{V_S}{V_R} \cdot 2^B;$$

$$B = \log_2(n_C) + N_2$$

Accordingly, the overall digital output signal $D_{out}$ is equivalent to that obtained with the second-stage ADC ($D_2$) but from an input signal that is amplified by a factor $n_C$. Hence, when referred to the complete ADC input, the quantization error in terms of root mean square (RMS) value of the second sub-ADC is divided by such factor. For example, if $n_C = 8$, then the overall B-bit ADC has an LSB that is 8 times smaller than that of the second sub-ADC, which amounts to saying that 3 extra bits are obtained over $N_2$. This way, an ADC with B=10 bits would be obtained by setting $n_C = 8$ and $N_2 = 7$. It is noted that these values are only examples and that, in general, other combinations are possible such as $n_C = 16$, $N_2 = 6$ or $n_C = 32$, $N_2 = 5$ or other combinations. The distribution of the overall resolution between the first and second stages can be optimized in practice, for instance in order to minimize the area and/or the power consumption.

FIG. 5 shows a possible circuit implementation of the entire ADC, in which the second sub-ADC is formed by an analog ramp generator, a digital ramp generator (up-counter), and an auto-zeroed comparator 510. The latter is controlled by two non-overlapped phases of signals ph6 and ph7 corresponding to switching on the switched ph6 and ph7, respectively.

It is noted that in FIG. 5, the switch "ph5" at the left-hand side of C3 could correspond to ph6. However, a different phase is used in practice in order to make ph6 switch-off slightly before ph5 is switched off. This is common practice in order to attenuate signal-dependent charge injection. During the on-phase of the switch ph6, data transferred from the first sub-ADC is sampled at a capacitor $C_3$ together with the OTA offset. OTA is held in feedback configuration (switch ph6 in the OTA feedback is closed). Capacitor $C_3$ here performs the function of the sample-and-hold (S/H) circuit 320. During the next cycles in which the signal ph7 has the "high" value, corresponding to switching on the switch ph7, the analog ramp is inputted through the same capacitor $C_3$. As soon as the analog ramp crosses the sampled voltage, the OTA (in an open-loop configuration with ph6 switch open) will commute, thus latching the current digital ramp code into a digital register 540.

In this implementation of a per-column parallel readout, the circuit content could be reduced to 2 OTAs, 1 comparator, 3 capacitors, 12 switches, 3 digital gates, 1 digital buffer, a $\log_2(n_C)$-bit counter, and a B-bit register, and the analog ramp and the digital ramp which are common to all readout channels. It is noted that the differential-input OTAs can be replaced by single-input inverting amplifiers for further silicon area reduction and power saving.

Thanks to the fact that the first sub-ADC employs oversampling and quantization-error processing (like sigma-delta ADCs), its operation is quite robust against circuit imperfections. For example, when referred to the input, the effect of circuit noise, OTA offset, finite gain and dynamics, comparison errors, etc. are attenuated by $1/n_C$; which renders the design of its building blocks inexpensive in terms of silicon area and power dissipation.

Furthermore, the same factor attenuates the possible errors in the second sub-ADC when they are referred to the complete ADC input.

FIG. 6 shows the Integral Non-Linearity (INL), the Differential Non-Linearity (DNL) and the transfer curve obtained a result of simulations of a two-stage ADC model with $n_C = 8$ and $N_2 = 7$, and a reasonable value for circuit non-idealities, including offset- and gain-errors in the second sub-ADC as well as non-linearity. In spite of these errors, overall INL is bounded by +/−1.5 $LSB_{10bit}$ and DNL is within +/−1 $LSB_{10bit}$.

As equation above for $D_{out}$ suggests, these good performances rely on the proper matching of the reference voltages used by the two sub-ADCs. Such a good match is provided, for instance when $V_{r1} = V_{r2}$. If this equality is not met, a larger non-linearity may appear. This effect is illustrated in FIG. 7, in the simulations of which a 10% deviation has been induced between the two references, the rest of the circuitry being ideal. As a result, a severe INL of +/−5 $LSB_{10bit}$ is obtained, which is noticeable at the bottom transfer curve.

Moreover, a rather large amount of missing codes may appear. The latter provokes artifacts in the processed images and should be avoided in order to get full benefit from the ADC. This problem is common to almost all multi-stage ADC topologies and limits their use in the image sensors.

In order to compensate for the non-matching reference voltages further embodiments of the present invention provides a correction/calibration procedure as described below. It is noted that in general, this calibration approach is not limited in its application and may also be utilized for different other ADC architectures such as different multiple-stage ADCs, pipelined ADCs or sub-ranging ADCs.

The calibration/correction methods in general aim at linearizing the ADC characteristics.

The following exemplary calibration/correction approach intends to avoid the impact of offset and gain mismatches between the two stages on the overall ADC linearity. For a single, isolated ADC both offset and gain (i.e., reference voltages) can be trimmed to get the ideal situation depicted in FIG. 8 (left-side drawing), in which the input signal range (denoted as "Px range" in the figure) perfectly fits the first-stage input range (denoted as "First-stage input range" in the figure) and the range of the residue generated also matches the second-stage input range (denoted as "$2^{nd}$-stage input range" in the figure).

This ideal situation leads to an inter-stage signal (residue) that is converted by the second stage without provoking saturation, so that the conversion error keeps bounded by +/−1 LSB of the intended overall resolution (shown in the right-side graph). The graph on the top shows size of the residue, whereas the graph on the bottom shows the corresponding conversion error.

However, in practice, and especially when many ADCs are working in parallel (like in the case of CIS with a per-column parallel A/D conversion scheme), circuits errors (like mismatch, ohmic drops due to non-zero resistance in supply and reference distributions, noise, etc.) may lead to the situation depicted in FIG. 9 (left-side drawing). Here, part of the input signal range lies outside the first-stage input range (thus causing low-level saturation) and, most importantly, part of the residue lies outside the second-stage input range. In this situation the residue cannot be properly digitized and the overall ADC suffers from large conversion errors (shown in the right-side graph). Moreover, since information is lost due to saturation, these errors cannot be sensed and corrected.

In order to prevent this from happening, the situation depicted in FIG. 10 is desirable. In this case successive signal ranges do not match but fit in each other; i.e., the first-stage input range has room for possible non-idealities (non-linearities) affecting the input signal and so does the second-stage with respect to the residue generated in the first one. Although nominal non-linearity is unavoidable (see conversion error at the right-side graph), since no information loss is produced due to saturations, calibration and correction of such non-linearity is perfectly possible, as shown in the right-side graph.

Manual trimming of multiple ADCs working in parallel is not feasible for practical applications and an automatic and robust linearization methodology should be devised. The linearization includes calibration (or sensing of the non-linear effect) and its correction. In general, the term "calibration" can be seen as referring to determining the deviation from the ideal state whereas the term "correction" refers to the suppression or reduction of the deviation. In summary, according to an embodiment of the present invention a correction means are provided for correcting a range of the signal entering the first stage or the signal entering the second stage ADC. The correction is performed in order to reduce the conversion error provoked by mismatch between the two input ranges. A correction of the offset and gain of the signal can be performed on the first or, alternatively, on the second stage digital output before combining the two outputs to form the overall digital output.

The results of the calibration are correction coefficients such as a gain and an offset to be applied to the signal for performing the correction. Thus, according to an embodiment of the present invention, means are provided for determining a correction gain and a correction offset to be applied by the correction means for correcting the output of the first-stage or the second-stage signal.

In general, the correction coefficients (offset and gain) can be obtained from two calibration signals that are converted using two configurations of the ADC regarding the number of comparisons made at the first stage ($n_C$). This general procedure is described below.

For simplified notation, let us define the normalized ADC output as the regular ADC output divided by $2^{N_2}$, with $N_2$ being the resolution of the second stage (in bits):

$$\delta = D/2^{N_2}$$

For a given value of $n_C$ and input signal $V_S$, and obviating the effect of quantization, we can write $$\delta = \sum_{i=0}^{n_C} Y_i + \frac{n_C V_S - V_{r1} \sum_{i=0}^{n_C} Y_i}{V_{r2}} + \delta_0 = S + \frac{n_C V_S - V_{r1} S}{V_{r2}} + \delta_0$$

where S denotes the first-stage count (summation of consecutive decisions of the comparator, $Y_j$, "0" or "1"). In this expression, $\delta_0$ stands for a possible offset error at the ADC output consequence of a difference between the offset of the first and second stages. In practice, typically the null input signal does not coincide with the ADC null output, but in order to avoid low-level saturation, an analog offset is intentionally added. Furthermore, a mismatched sub-ADC gain is mapped into different values for the sub-ADC reference voltages $V_{r1}$ and $V_{r2}$.

Consider now two different inputs $V_{Sl}$ and $V_{Sh}$ and two different settings of the $n_C$, namely $n_{C1}$ and $n_{C2}$. The corresponding normalized digital outputs will be:

$$\delta_{l1} = S_{l1} + \frac{n_{C1} V_{Sl} - V_{r1} S_{l1}}{V_{r2}} + \delta_0$$

$$\delta_{l2} = S_{l2} + \frac{n_{C2} V_{Sl} - V_{r1} S_{l2}}{V_{r2}} + \delta_0$$

$$\delta_{h1} = S_{h1} + \frac{n_{C1} V_{Sh} - V_{r1} S_{h1}}{V_{r2}} + \delta_0$$

$$\delta_{h2} = S_{h2} + \frac{n_{C2} V_{Sh} - V_{r1} S_{h2}}{V_{r2}} + \delta_0$$

where $S_{l1} = \sum_{i=0}^{n_{C1}} Y_i$; etc.

If $V_{Sl}$ is chosen low enough so that both $S_{l1}$ and $S_{l2} = 0$, the first two equations can be simplified to $$\delta_{l1} = \frac{n_{C1} V_{Sl}}{V_{r2}} + \delta_0$$

$$\delta_{l2} = \frac{n_{C2} V_{Sl}}{V_{r2}} + \delta_0$$

and it follows that $$\delta_0 = \frac{n_{C2} \delta_{l1} - n_{C1} \delta_{l2}}{n_{C2} - n_{C1}}$$

which holds no matter the value of the input signal $V_{Sl}$.

The exact value of the calibration signal $V_{Sl}$ is unimportant provided that it remains the same for the two conversions performed with $n_{c1}$ and $n_{c2}$. In practice, a constant, non-zero voltage can be provided as the ADC input for such a purpose.

On the other hand, the second pair of equalities can be solved for $V_{r1}$ and $V_{r2}$ and compute their ratio, which yields $$\frac{V_{r1}}{V_{r2}} = \frac{n_{C2}[(\delta_{h1} - \delta_0) - S_{h1}] - n_{C1}[(\delta_{h2} - \delta_0) - S_{h2}]}{n_{C1} S_{h2} - n_{C2} S_{h1}}$$

for any $V_{Sh}$ subjected to $$n_{C1} S_{h2} \neq n_{C2} S_{h1}.$$

In order to fully determine the ratio $V_{r1}/V_{r2}$ from measurements, we replace $\delta_0$ by its value previously calculated, $$\delta_0 = \frac{n_{C2} \delta_{l1} - n_{C1} \delta_{l2}}{n_{C2} - n_{C1}}$$

and obtain $$\frac{V_{r1}}{V_{r2}} = \frac{n_{C2}[(\delta_{h1} - \delta_{l1}) - S_{h1}] - n_{C1}[(\delta_{h2} - \delta_{l2}) - S_{h2}]}{n_{C1}S_{h2} - n_{C2}S_{h1}}.$$

The requirement $n_{C1}S_{h2} \neq n_{C2}S_{h1}$ is met for one or several regions of the input signal range, depending on the values of $n_{C1}$ and $n_{C2}$. For example, for $n_{C1}=1$ and $n_{C2}=2$ (the simplest possible choice) this inequality is held for any input in the range $(V_{r1}/2\ V_{r1}]$, where $S_{h1}=0$ and $S_{h2}=1$. FIG. 11 illustrates the situation for $n_{C1}=2$ and $n_{C2}=4$:

Note that $V_{Sh}$ should be contained in the $2^{nd}$ quarter or in the $4^{th}$ quarter of the input signal range. In general, the higher the values of $n_{C1}$ and $n_{C2}$, the narrower are the regions of the input range that satisfy $n_{C1}S_{h2} \neq n_{C2}S_{h1}$. Hence, the beneficial impact of increasing the calibrating $n_C$ (regarding the effect of the quantization noise) is soon masked by the fact that the results are more sensitive to the location of the calibrating input signal $V_{Sh}$, thus rendering the calibration process less robust against noise and interferences. An interesting choice though is $n_{C1}=2$ and $n_{C2}=3$ whose results are depicted in FIG. 12.

Note that $n_{C1}S_{h2} \neq n_{C2}S_{h1}$ for ⅔ of the input range. The bottom graph represents the denominator of the ratio $V_{r1}/V_{r2}$ (i.e., $n_{C1}S_{h2}-n_{C2}S_{h1}$), which becomes ±1 or 2. These three possible cases are easily implementable digitally because none of them requires actual division, but inversion or shifting.

Accordingly, advantageously the settings for determining the correction gain and offset are one of $n_{C1}=1$ and $n_{C2}=2$, $n_{C1}=2$ and $n_{C2}=4$ or $n_{C1}=2$ and $n_{C2}=3$. However, the present invention is not limited thereto and, as shown above, in general any other combination may be employed. It is beneficial to select a combination leading to a simple circuit implementation due to simpler calculation formula.

A simplified version of the equation for $V_{r1}/V_{r2}$ can be obtained if $V_{Sh}$ is chosen so that $S_h = n_C - 1$ for any value of $n_C$. The latter is equivalent to select an input that produces the maximum count at the first-stage sub-ADC output (before saturation of the whole ADC). With this $V_{r1}/V_{r2}$ simplifies to $$\frac{V_{r1}}{V_{r2}} = 1 - \frac{n_{C1}(\delta_{h2} - \delta_{l2}) - n_{C2}(\delta_{h1} - \delta_{l1})}{n_{C2} - n_{C1}}$$

Although theoretically possible, $V_{Sl}=0V$ is not a convenient choice in practice because the second-stage sub-ADC may produce a saturated-low output code. As explained above, in practice an offset is intentionally added to the zero-level input signal in order to avoid the loss of information caused by saturation. Thus, final simplified expressions for the correction offset, correction gain of the first-stage input and correction gain of the second-stage input are $$D_{off} = 2^{N_2}\delta_0 = 2^{N_2}\frac{n_{C2}\delta_{l1} - n_{C1}\delta_{l2}}{n_{C2} - n_{C1}}$$

$$K_{corr1} = \frac{V_{r1}}{V_{r2}} = 1 - \frac{n_{C1}(\delta_{h2} - \delta_{l2}) - n_{C2}(\delta_{h1} - \delta_{l1})}{n_{C2} - n_{C1}}$$

$$K_{corr2} = \frac{V_{r2}}{V_{r1}}$$
$$= 1 \Big/ \Big[1 - \frac{n_{C1}(\delta_{h2} - \delta_{l2}) - n_{C2}(\delta_{h1} - \delta_{l1})}{n_{C2} - n_{C1}}\Big]$$
$$\approx 1 + \frac{n_{C1}(\delta_{h2} - \delta_{l2}) - n_{C2}(\delta_{h1} - \delta_{l1})}{n_{C2} - n_{C1}}$$

The latter expression for $K_{corr2}$ is an implementation-efficient approximation valid when the $V_{r1}$ vs. $V_{r2}$ mismatch is not excessive, because no inversion is needed (only addition and bit shifting if $n_{C1}$ and $n_{C2}$ are selected as power-of-two integers).

The correction involves an addition of an offset ($D_{off}$) and a multiplication by a gain coefficient ($K_{corr}$). The latter can be applied to the first-stage output (via $K_{corr1}$) or to the second-stage output (via $K_{corr2}$) before they are combined to form the overall ADC output.

Nevertheless, manipulation of the second-stage output yields best results in a multiple parallel conversion scenario. The reason is that potential inaccuracy of the correction coefficients may map into large channel-to-channel errors when applied to the MSBs. Applying the correction to the LSBs (second-stage output) is then preferable for practical reasons.

In fact, in order to increase the accuracy in the estimate (via calibration) of the correction coefficients data, averaging or filtering may advantageously be used. This way the impact of noise or interferences on the obtained coefficient values can be largely attenuated.

Here two approaches are envisaged, the first one based on a foreground (off-line) calibration and the second one being a background calibration (i.e. compatible with the normal operation of multiple ADCs within a CIS).

In both cases, the correction procedures and associated calculations to get the correction coefficients can be implemented either on- or off-chip, depending on the application and its internal and external resources.

In the following, the calibration by averaging shall be described which is performed off-line, i.e. when the CIS does not perform image capturing/processing.

Once selected $n_{C1}$ and $n_{C2}$ values, each the calibration output data, $\delta_{h2}$, $\delta_{l2}$, $\delta_{h1}$, $\delta_{l1}$ (corresponding to the combinations $n_{C2}$ & $V_{Sh}$, $n_{C2}$ & $V_{Sl}$, $n_{C1}$ & $V_{Sh}$, and $n_{C1}$ & $V_{Sl}$, respectively) is obtained a number of times M and these values are averaged prior to computing the correction coefficients as follows (the bar over $\delta_{h2}$, $\delta_{l2}$, $\delta_{h1}$, $\delta_{l1}$ denotes the averaging performed):

$$D_{off} = 2^{N_2}\delta_0 = 2^{N_2}\frac{n_{C2}\overline{\delta}_{l1} - n_{C1}\overline{\delta}_{l2}}{n_{C2} - n_{C1}}$$

$$K_{corr2} = 1 + \frac{n_{C1}(\overline{\delta}_{h2} - \overline{\delta}_{l2}) - n_{C2}(\overline{\delta}_{h1} - \overline{\delta}_{l1})}{n_{C2} - n_{C1}}$$

In CIS, this method can be implemented by stopping the regular image acquisition and performing a set of calibration acquisitions in which the outputted images are formed exclusively by calibration data. After computing the correction coefficients as explained above, these are applied to all images in a regular sequence. It is not expected that correction coefficients change abruptly in time unless there are changes in supply or temperature or internal CIS configuration. Thus, in principle a calibration cycle should be executed only at the power up of the sensor or whenever the environment conditions change substantially. However, the present invention is not limited thereto and a regular calibration may be performed also at predefined time intervals, or in another way.

In summary, in accordance with the "off-line" calibration embodiment, the determination means may further include averaging means for performing the determination of values used in calculation of the correction gain and correction offset multiple times, M; for averaging these values and for calculating the gain and the offset using the averaged values.

Below, a Calibration by filtering is described. This approach may be performed on-line, i.e. during the operation of the CIS—on the "background" of the normal operation.

In some applications, stopping the image acquisition is not possible or not suitable. Hence, a background (on-line) calibration method is proposed as follows:

Forming part of every regular image there are four rows with calibration data (one for $\delta_{l1}$, another one for $\delta_{l2}$, etc.), each value in a row corresponding to one ADC (assuming per-column parallel conversion).

These calibration data are obtained from two dedicated lines in the pixel array, one preset to drive the ADCs with $V_{Sl}$ and the other preset to drive them with $V_{Sh}$. One possible implementation is that each "pseudo pixel" of the calibrating line contains a buffer used to locally drive the corresponding ADC. Since the calibration is not sensitive to the exact values of $V_{Sh}$ and $V_{Sl}$, linearization is unaffected by possible mismatches among local buffers. This makes possible to implement those local buffers by using inexpensive source followers, for example.

Per-image calibration data are used to compute the instantaneous values of the $D_{off}$ and $K_{corr2}$ for each ADC; the actual values being obtained by low-pass filtering the instantaneous values. As an example, a first-order low-pass IIR filter can be used as follows:

$$K_{corr2,LP}(n) = \alpha \cdot K_{corr2}(n) + (1-\alpha) \cdot K_{corr2,LP}(n-1)$$

where n is the image (iteration) count and $0 < \alpha < 1$. In practice, the value of a should be adjusted to get enough convergence speed with sufficiently stable value of the correction coefficient. More sophisticated filters are also usable.

Per-image non-calibration regular data are corrected with the filtered values of the coefficients available at the time. At the beginning of a sequence after power up, it may take some images to get accurate, stable values for the correction coefficients. After that, the filtering process will track any changes in the environment (supply, temperature, etc.) or in CIS configuration, without requiring stopping image acquisition for recalibration. Moreover, the filter memory (current value of the filtered coefficient) does not need to be reset after a sequence of images, but it can be kept for the following one, thus speeding up the convergence. In summary, in accordance with the "background" calibration embodiment, the pixel array comprises two additional signal lines for driving the ADCs with the respective two calibration signals. The determination means obtains an instantaneous value used in calculating the correction data and filters the instantaneous value with a low-pass filter before using it for the calculation of the correction data. In particular, the filtering may be performed as a running weighted average of the current value and a previous one or more values. However, any other filtering approach may also be employed.

In the following a particular example of a calibration and correction is provided as described above, however also considering the input signal with a value of zero. According to this exemplary embodiment of the invention, the calibration procedure performs two consecutive conversions with the same input signal. For instance, during the first conversion, the number of bits to be converted $n_C$ is set to 1, whereas in the second conversion $n_C$ is set to 2. In this manner, the ADC output for the $1^{st}$ conversion will be:

$$D_{out,I} = 2^{N_2} \left( \sum_{i=0}^{1} Y_i + \frac{V_S - V_{r1} \sum_{i=0}^{1} Y_i}{V_{r2}} \right) = \frac{V_S}{V_{r2}} 2^{N_2}$$

while the ADC output for the $2^{nd}$ conversion will be:

$$D_{out,II} = 2^{N_2} \left( \sum_{i=0}^{2} Y_i + \frac{2V_S - V_{r1} \sum_{i=0}^{2} Y_i}{V_{r2}} \right) \leq \frac{2V_S}{V_{r2}} 2^{N_2} + \left(1 - \frac{V_{r1}}{V_{r2}}\right) 2^{N_2}$$

These resulting relations for $D_{out,I}$ and $D_{out,II}$ are obtained by applying the assumptions summarized in the following. In particular, it has been considered that for $0 \leq V_S \leq V_{r1}$ as explained above, the following terms apply:

$$\sum_{i=0}^{1} Y_i = 0 \text{ and } \sum_{i=0}^{2} Y_i \leq 1$$

For a large enough $V_S$, so that the equality holds, it follows:

$$\frac{V_{r1}}{V_{r2}} = 1 - \frac{(D_{out,II} - 2D_{out,I})}{2^{N_2}}$$

Accordingly, in order to correct for the mismatch in the first and the second reference voltages $V_{r1}$ and $V_{r2}$ a scale factor $K_{corr2}$ may be determined as follows:

$$K_{cor2} = \frac{V_{r2}}{V_{r1}} = \left[1 - \frac{(D_{out,II} - 2D_{out,I})}{2^{N_2}}\right]^{-1}$$

The correction factor $K_{corr2}$ is then applied to the second sub-ADC output. The result of a simulation with this correction is shown in FIG. 13. In FIG. 13 it can be seen that the linearity is recovered to a desired level.

A correction factor $K_{cor1}$ may be applied to the first sub-ADC output:

$$K_{cor1} = \frac{V_{r1}}{V_{r2}} = 1 - \frac{(D_{out,II} - 2D_{out,I})}{2^{N_2}}$$

This correction leads to the same results.

Another source of non-linearity is found in a possible offset between the full-scales of the first-stage ADC and the second-stage sub-ADC. The mismatch between the scales may lead to saturation of the respective sub-ADCs, with a significant impact on overall linearity.

In order to avoid this effect, in accordance with another embodiment of the invention, the offset is sensed and corrected. In order to determine the offset the ADC is input a zero signal for converting it. In particular, $V_S$ is set to zero and the output signal is detected:

$$D_{out} = \frac{n_C V_S}{V_R} \cdot 2^{N_2} + D_{off} = D_{off}; \text{ if } V_S = 0$$

The output signal corresponds to the offset $D_{off}$.

FIG. 14 exemplifies a version of the ADC scheme as described with reference to FIG. 3, which incorporates the correction performed by coefficients $K_{cor1}$ or $K_{cor2}$ and the determined offset. In particular, as can be seen from FIG. 14, the offset $D_{off}$ is applied to the output of the second-stage ADC before its addition to the output of the first-stage ADC. In particular, the determined offset is added at the adder 930 to the output $D_2$ of the second-stage ADC. Moreover, the correction coefficients $K_{cor1}$ or $K_{cor2}$ are applied to scale the output of the first and the second stage ADC, respectively. In particular, the coefficient $K_{cor1}$ is applied to scale the output $D_1$ of the first-stage ADC. This may be performed by applying 910 the gain corresponding to the gain of the most significant bits $K_1$ multiplied by the coefficient $K_{cor1}$. Moreover, the output of the offset-corrected signal $D_2-D_{off}$ is scaled by the gain 920 corresponding to the determined correction coefficient $K_{cor2}$.

In the following, an example of the procedure for determining both the offset and the correction coefficients (calibration phase) is described. During the calibration phase, which is advantageously performed in the power-up phase or just prior to image acquisitions, the ADC is configured to convert two different inputs in order to correct for the offset:
  a) The Null (zero) input signal is converted.
  b) A large enough predefined input signal, for example $\sim\!\!{}^{3}\!/_{4} V_{r1}$ is converted.

It is noted that in the setting b) the voltage height may be selected differently. However, it is beneficial when the value is higher than ½ $V_{r1}$. input signal should be high enough to represent the upper input voltage range.

Moreover, two different settings for calculating the $K_{cor1}$ or $K_{cor2}$ parameters as described above are considered. These settings regard the number of consecutive comparisons in the first sub-ADC, $n_C$:
  i) $n_C$=1, and
  ii) $n_C$=2

It is noted that the settings of $n_C$ being 1 and 2 have been selected as shown above for a simple and robust calculation of the correction parameters $K_{cor1}$ or $K_{cor2}$. However, the present invention is not limited thereto and in general, any two different values for $K_{cor1}$ or $K_{cor2}$ may be applied to calculate the ratio of the reference voltages $V_{r1}$ and $V_{r2}$ which is then inversed to obtain the correction coefficient as shown above. However, as shown above, the respective values of 1 and 2 have the advantage of simplifying the calculation when the assumptions about the size of Vs are fulfilled.

An example of the combined inputs and settings for calculating the offset and the correction parameter is:
  a)+i) corresponding to Vs=0 and $n_C$=1,
  b)+i) corresponding to Vs set to a second (higher) value and $n_C$=1, and
  b)+ii) corresponding to Vs set to the second value and $n_C$=2.

For each of these combinations, preferably several conversions are performed and the resulting output codes are averaged in order to mitigate the impact of the temporal noise. Alternatively, as shown above, a background calibration may be performed in which the values are filtered instead of averaging.

After the predefined number of conversions of the predefined combinations of the input voltage and the number of comparisons, the offset and the correction parameter is obtained as follows:
  a)+i) results in $D_{off}$=average($D_{out}$)
  b)+i) results in $D_{out,I}$ average($D_{out}$)
  b)+ii) results in $D_{out,II}$=average($D_{out}$)
based on which the correction parameter is obtained as follows:

$$K_{cor2} = \left[1 - \frac{D_{out,II} - 2D_{out,I}}{2^{N_2}}\right]^{-1}$$

The correction coefficients (two per channel) may be stored on-chip or off-chip depending on the applied CIS architecture. The corrections may be applied as $D_1$ and $D_2$ are serialized out.

It is noted that the above correction of the offset may be employed independently of the correction by the coefficients $K_{cor1}$ or $K_{cor2}$. This means that an ADC may only employ one of the two corrections.

It is noted that the present invention is not limited to performing more conversions and that, in general, also a single conversion for each of the above combination might be used. However, the more conversions, the more precise correction (calibration). Moreover, the combinations of the input voltage and the number of comparisons may be selected differently.

Another example may be the pair of values for $n_C$ that enter the calibration process being higher, for example $n_C$=3 and $n_C$=4. In this case, a calibration input signal must be selected so that:

$$\sum_{i=0}^{3} Yi = 2 \text{ for } n_C = 3, \text{ and } \sum_{i=0}^{4} Yi = 3 \text{ for } n_C = 4.$$

In this case, the relation $$K_{cor1} = \frac{V_{r1}}{V_{r2}} = 1 - \frac{(D_{out,II} - 2D_{out,I})}{2^{N_2}}$$

still applies. In general, for an arbitrary selection of the $n_C$ pair of values ($n_{C2}$ and $n_{C1}$), and applying a large enough calibrating signal so that the output of the first stage takes its maximum value for both $n_C$ settings, it can be shown that $$K_{cor1} = \frac{V_{r1}}{V_{r2}} = 1 - \frac{n_{C1} D_{out,II} - n_{C2} D_{out,I}}{(n_{C2} - n_{C1}) 2^{N_2}}.$$

For any pair of values satisfying $n_{C2}$=$n_{C1}$+1, the above equation for $K_{cor1}$ remains the same (and similarly for $K_{cor2}$=$K_{cor1}^{-1}$). The advantage of selecting larger values of $n_C$ is that possible errors in the second stage (like quantization, circuit noise, supply/ground bouncing, etc.) have a lower impact on the overall digital output, thus yielding a more precise correction coefficient $K_{cor1}$ or $K_{cor2}$. It is noted that this expression for $K_{cor1}$ is the same as the previously shown expression:

$$\frac{V_{r1}}{V_{r2}} = 1 - \frac{n_{C1}(\delta_{h2} - \delta_{l2}) - n_{C2}(\delta_{h1} - \delta_{l1})}{n_{C2} - n_{C1}}$$

provided that $\delta_{l1} = \delta_{l2} = 0$, which is the case when $V_{SI} = 0V$ and $\delta_0 = 0$ (and $\delta = D/2^{N_2}$). The above formula for $V_{r1}/V_{r2}$ is thus more general. As described above, the present embodiment is only an example and in practice it may be beneficial to select a non-zero signal.

FIG. 15 shows in the top graph the simulated INL without correction assuming a 12.5% deviation between $V_{r1}$ and $V_{r2}$. The INL graph in the middle of FIG. 15 corresponds to the calibrated case, where the correction coefficients have been obtained with $n_{C1} = 1$ and $n_{C2} = 2$. At the bottom of FIG. 15 is the calibrated INL after correction with the coefficients obtained using $n_{C1} = 3$ and $n_{C2} = 5$. As can be seen from the figure, the bottom graph obtained for the higher $n_C$ values experiences a lower INL peak.

It is noted that the present invention is not limited to the examples of calibration provided above. Another calibration method is based on breaking the loop of the first stage by making the first stage operate as an integrator. This can be achieved by gating the comparator decision so that the $V_{r1}$ based signal is never subtracted from the accumulated input. For a small constant input, successive integrations allow sweeping the input range of the second stage, thus obtaining a measure of its input-output curve. In particular, the calibration input may be a signal which is derived from the reference voltage $V_{r1}$.

With this calibration data, coefficient can be derived to correct static errors in the second ADC stage, including offset and gain errors, as well as to smooth non-linearities.

As an example, FIG. 16 below shows the second stage static characteristic (solid line with circles "o") including gain and offset errors and 10% second order non-linearity. It has been obtained by applying a constant input equal to $\frac{1}{8}*V_{r1}$ and making successive conversions with $n_C = 1$ to 8. However, it is noted that this is only an example and that another proportion may be selected. Then, non-linearity fitting is used to compute the correction coefficients needed to linearize such response. The result is displayed by a solid line with crosses (x) in the figure. For comparison, the ideal characteristic is also shown (dashed curve).

FIGS. 17 and 18 show the non-linearity plots before and after this correction. In particular, FIG. 17 shows non-linearity without calibration under 12.5% gain error and 10% non-linearity error. FIG. 18 shows the non-linearity after correction using the above introduced alternative calibration method.

This second approach relies on the fact that the constant calibration input is well controlled (related to $V_{r1}$ by a known amount). In practice, this can be achieved by deriving the calibration voltage from $V_{r1}$ via a resistive or capacitive voltage divider, whose good matching properties allow lowering the error in the calibration voltage down to the required level.

Summarizing, a in this embodiment, a method is provided for calibration of the two-stage analog to digital converter including the steps of: setting a constant input signal to a proportion of reference voltage used in the first-stage comparator such that the integrator accumulates the input signal, performing a predefined number of converting steps to obtain an output of the second stage, based on the input and output, calculating the correction factor, applying the correction factor to the second-stage signal.

As can be seen above, the present invention provides a readout approach particularly suitable for the CIS applications. In particular, the readout channel of CIS is often composed of a CDS amplifier followed by an ADC as described above. Usually, in these readout channels the CDS amplifier gain is set either manually or adapted to the pixel signal, so that the higher gain is applied to low-level signals. However, in order to avoid saturation of the ADC, the maximum gain that can be applied to the large enough signals is unity. In accordance with the present invention, a constant high gain is applied along to the full pixel signal range, regardless of its level. The gain corresponds to the number of comparisons performed in the first stage. For each comparison, integration is performed. An integrator (accumulator) with a constant input can be seen as an amplifier, the gain of which is given by the number of integrations. Each integration accumulates a fraction "g" of the signal. If there were no subtraction (delta), and assuming no clipping in the integrator output, the accumulated signal would be $n_C * g * V_{sig}$. When the signal is passed to the second stage, it is amplified by $1/g$, which corresponds to $n_C * V_{sig}$. Accordingly, the actual gain corresponds to $n_C$. The presence of the delta subtraction 250 avoids clipping while preserving the benefit of the gain.

This allows simplifying the control and reducing the ADC error contributions when referred to the readout channel input. In addition, the input referred noise is reduced because the high gain applied to all samples. The delta mechanism avoids the saturation even for high amplifications values.

The speed of the proposed ADC is boosted by the sub-ranging, i.e. by providing multiple stages. The two-stage ADC here is $n_C$ times faster than a single-stage ramp ADC, with $n_C$ being the number of consecutive comparisons performed at the first sub-ADC. It is noted that the present invention is not limited to a two-stage conversion and may further be applied to cascading of more than two stages.

The self-calibration and correction procedure as described in an embodiment above results in higher robustness of the two-stage ADC against mismatches between sub-ADC offset and gain errors. It is noted that the calibration and correction procedure may also be used for other architectures than the two-stage ADC shown above. In particular, it is suitable for any multistage architectures in which a gain and/or an offset mismatch between the stages occurs.

The calibration and correction approach is especially beneficial for CIS readout channels in order to suppress the non-linearities. In other applications, where a single ADC is used, the important point is that this ADC has a good performance. However, in a CIS circuitry with hundreds or thousands of readout channels, it is not only important that every readout channel has a good performance, but rather that all channels have as much as possible the same (similar) behavior. This is very difficult to achieve in an intrinsic manner. The ramp converters enable this feature because they usually share the same references for all readout channels. Even in this case, other non-idealities must be taken into account. With the above described calibration and correction approach, the equalization of multiple readout channels can be performed automatically for a bunch of ADC architectures. Another advantage of this calibration is that it does not require an extra specific hardware at the readout channel level. Only the controlling waveforms (which are global for all channels) need to be modified. This mans that only the signals applied to the input of the converters in accordance with the above described combinations of a), b), i) and ii) settings are provided to the ADC architecture which does not require any additional hardware apart from implementing the addition of the offset and configuration of the scaling gain.

The present invention as described above provides several advantages in comparison with the prior art. According to the present invention, a maximum constant gain may be applied to the pixel signal, without requiring either external programmability or self-adaption. Thus, the impact of the circuit errors in the second sub-ADC (which are attenuated by the gain applied in the first sub-ADC since $\beta \cdot g=1$) is minimized.

Summarizing the advantages of the present invention, it minimizes the impact of the circuit errors in the first sub-ADC by using oversampling (applying an integrator in an incremental or sigma-delta loop) and error-processing. The control of the readout channel is easier as the control phases (switch operation) are always the same, independently of the pixel signal level. The architecture can be easily extended to higher resolutions. In particular, it is very appropriate for trading off accuracy and conversion time. Every time the conversion time is doubled, 2 additional bits can be obtained from the ADC (1 per sub-ADC) with little cost and keeping the same control waveforms. It is very suitable for per-column parallel readout as the required amount of circuitry (circuit content) is small. The incremental/sigma-delta first stage may be advantageously combined with very good results with the single-ramp approach ADC, which is one of the less demanding architectures in terms of power and area consumption. If the CMOS CIS process is used, all circuitry can be included inside the same chip, which reduces the cost. Since the digital circuitry can operate with a lower supply voltage, the total power consumption will be lower than with other approaches.

Another embodiment of the invention relates to the implementation of the above described various embodiments using hardware and software. It is recognized that the various embodiments of the invention may be implemented or performed using computing devices (processors). A computing device or processor may for example be general purpose processors, digital signal processors (DSP), application specific integrated circuits (ASIC), field programmable gate arrays (FPGA) or other programmable logic devices, etc. The various embodiments of the invention may also be performed or embodied by a combination of these devices.

In particular, an integrated circuit may embody the analog to digital converter as described above. The integrated circuit may be a CIS with an image sensor formed by a matrix of pixels as shown schematically in FIG. 19. Each pixel includes a photo-electric means for converting the light into an electric signal. The CIS further includes a selection circuit for sequentially selecting a row or multiple rows of pixels, and a column readout circuit for reading out in parallel a plurality of the pixels from different columns of the selected pixel row(s). A plurality of rows may be selected in parallel. Correspondingly, there may be more than one readout channel per column, i.e. also the plurality of rows may be converted in parallel. The readout circuit may include a plurality of analog to digital converters as described above and operating in parallel (stages).

Summarizing, the present invention relates to a two- or multiple-stage analog to digital converter. The converter preferably includes an incremental ADC in the first stage. The incremental ADC comprises an integrator and a comparator. After the predefined number of comparisons performed by the comparator, the output of the integrator appropriately scaled is provided to the second stage where it is further sampled. In particular, the scaling gain is inversely proportional to the integrator gain. The second ADC performs the conversion of the remaining least significant bits and then the output of both stages is combined.

The invention claimed is:

1. An analog to digital converter for converting an analog signal from an image sensor to a digital value, the converter comprising:
   a first stage including a first analog to digital converter for obtaining a first number of bits of the digital value, the first analog to digital converter comprising an integrator with a first gain and a comparator for comparing the integrated signal with a first reference signal;
   an intermediate amplifier for multiplying the output of the integrator after conversion of the first number of bits in the first stage by a predetermined gain based on the first gain; and
   a second stage including a second analog to digital converter for obtaining a second number of bits of the digital value based on the signal input from the intermediate amplifier, wherein the second analog to digital converter is a ramp analog to digital converter and comprises
   a comparator for comparing the signal input to the second analog to digital converter with a reference analog ramp signal, and
   a digital register for storing the digital value corresponding to the time period in which the analog ramp signal crosses the input signal.

2. The analog to digital converter according to claim 1, wherein the first analog to digital converter is an incremental analog to digital converter further including a digital counter for accumulating the decisions of the comparator.

3. The analog to digital converter according to claim 1, further comprising an adder for adding the converted signal output from the first analog to digital converter according and scaled to the output from the second analog to digital converter.

4. The analog to digital converter according to claim 1, wherein the predetermined gain is an inverse of the first gain of the integrator.

5. The analog to digital converter according to claim 1, further comprising a gain correction means for compensating a mismatch between the reference signals input to the first stage and to the second stage, the gain correction means including:
   a first amplifier for scaling the signal output from the first analog to digital converter by a first gain which is determined based on the digital signals obtained by conversion through the first and second stage of the analog to digital converter with a respective different settings of the number of comparisons performed by the comparator, and/or
   a second amplifier for scaling the signal output from the second analog to digital converter by a second gain which is determined based on the digital signals obtained by conversion through the first and second stage of the analog to digital converter with a respective different settings of the number of comparisons performed by the comparator.

6. A method for calibrating and correcting the two-stage analog to digital converter of claim 5 comprising the steps of:
  determining a first calibration output signal by converting a first predefined signal by employing a first number of comparisons by the comparator,
  determining a second calibration output signal by converting the first predefined signal by employing a second number of comparisons by the comparator,
  determining a correction gain based on the determined first and second calibration output signal by calculating based thereon a ration between the reference signals input to the first and the second stage analog to digital converters, and
  correcting the signal output by the first and/or the second stage by the determined correction gain.

7. The method according to claim 6, further comprising the step of
  determining an offset by converting with the two-stage analog to digital converter a zero input signal with the number of comparator decisions set to the first number of comparisons,
  subtracting the determined offset from the signal output from the second analog to digital converter, and
  the step of correcting the signal output by the second stage and already corrected by the step of subtracting the determined offset.

8. A method for calibrating and correcting the two-stage analog to digital converter of claim 5 comprising the steps of:
  determining an offset by converting with the two-stage analog to digital converter a zero input signal, and
  subtracting the determined offset from the signal output from the second analog to digital converter.

9. The analog to digital converter according to claim 1, further comprising an offset correction means for compensating an offset due to a mismatch between the reference signals input to the first stage and to the second stage, the offset correction means including an offset subtractor for subtracting an offset from the output of the second analog to digital converter.

10. The analog to digital converter according to claim 1, wherein the integrator of the first analog to digital converter is implemented by means of a switched capacitor operational transductance amplifier.

11. An integrated circuit embodying the analog to digital converter according to claim 1.

12. The integrated circuit according to claim 11 further comprising
  an image sensor formed by a matrix of pixels, each pixel including a photo-electric means for converting the light into an electric signal,
  a selection circuit for sequentially selecting at least one row of pixels, and
  a column readout circuit for reading out in parallel a plurality of the pixels from different columns of the selected at least one pixel row.

13. The integrated circuit according to claim 12, wherein the readout circuit includes a plurality of the analog to digital converters operating in parallel.

14. The integrated circuit according to claim 12, wherein the readout circuit further comprises a correlated double sampling circuit of which the output is provided to the analog to digital converter.

* * * * *